United States Patent
Ramesh

(10) Patent No.: US 10,942,889 B2
(45) Date of Patent: Mar. 9, 2021

(54) BIT STRING ACCUMULATION IN MEMORY ARRAY PERIPHERY

(71) Applicant: Micron Technology, Inc., Boise, ID (US)

(72) Inventor: Vijay S. Ramesh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/430,689

(22) Filed: Jun. 4, 2019

(65) Prior Publication Data

US 2020/0387472 A1    Dec. 10, 2020

(51) Int. Cl.
  *G06F 15/78*    (2006.01)
  *G06F 9/30*    (2018.01)
  *G11C 7/08*    (2006.01)

(52) U.S. Cl.
  CPC ...... *G06F 15/7864* (2013.01); *G06F 9/30014* (2013.01); *G06F 9/30018* (2013.01); *G11C 7/08* (2013.01)

(58) Field of Classification Search
  None
  See application file for complete search history.

(56) References Cited

U.S. PATENT DOCUMENTS

| | | | | |
|---|---|---|---|---|
| 4,758,972 A | * | 7/1988 | Frazier | G06F 7/485 708/497 |
| 5,038,312 A | * | 8/1991 | Kojima | G06F 9/3877 708/441 |
| 7,865,541 B1 | * | 1/2011 | Langhammer | G06F 7/483 708/204 |
| 8,214,417 B2 | * | 7/2012 | Ahmed | G06F 7/49915 708/505 |
| 8,943,447 B2 | * | 1/2015 | Drane | G06F 30/30 716/103 |

(Continued)

OTHER PUBLICATIONS

Gustafson, et al., "Beating Floating Point as its Own Game: Posit Arithmetic", Research Paper, retrieved from <http://www.johngustafson.net/pdfs/BeatingFloatingPoint.pdf>, Jan. 2017, 16 pages.

(Continued)

*Primary Examiner* — Eric Coleman
(74) *Attorney, Agent, or Firm* — Brooks, Cameron & Huebsch, PLLC

(57) ABSTRACT

Bit string accumulation in a memory array periphery is described. Control circuitry (e.g., a processing device) may be utilized to control performance of operations using bit strings within a memory device. Results of the operations may be accumulated in circuitry peripheral to a memory array of the memory device. For instance, a plurality of sense amplifiers may be coupled to a memory array and a processing device. A quantity of sense amplifiers among the plurality of sense amplifiers can be the same as a quantity of rows or columns of the array. The processing device may be configured to cause performance of a recursive operation using one or more bit strings that are formatted according to a Type III universal number format or a posit format. The processing device may further be configured to cause resultant bit strings representing results of iterations of the recursive operation to be accumulated in the plurality of sense amplifiers.

22 Claims, 7 Drawing Sheets

(56) References Cited

U.S. PATENT DOCUMENTS

| | | |
|---|---|---|
| 2003/0126174 A1 | 7/2003 | Kawata |
| 2005/0160129 A1 | 7/2005 | Endo |
| 2011/0289376 A1 | 11/2011 | Maccarrone et al. |
| 2016/0062692 A1* | 3/2016 | Finkbeiner ........... G11C 7/1009 711/154 |
| 2016/0225422 A1* | 8/2016 | Tiwari ................ G11C 7/1036 |
| 2017/0011782 A1 | 1/2017 | Manning |
| 2018/0294035 A1 | 10/2018 | Vali et al. |

OTHER PUBLICATIONS

ISR and Written Opinion from related International Application No. PCT/US2020/028658, dated Jul. 28, 2020, 12 pages.

* cited by examiner

BIT STRING ACCUMULATION IN MEMORY ARRAY PERIPHERY

TECHNICAL FIELD

The present disclosure relates generally to semiconductor memory and methods, and more particularly, to apparatuses, systems, and methods for bit string accumulation in memory array periphery.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

DETAILED DESCRIPTION

Figure 1:
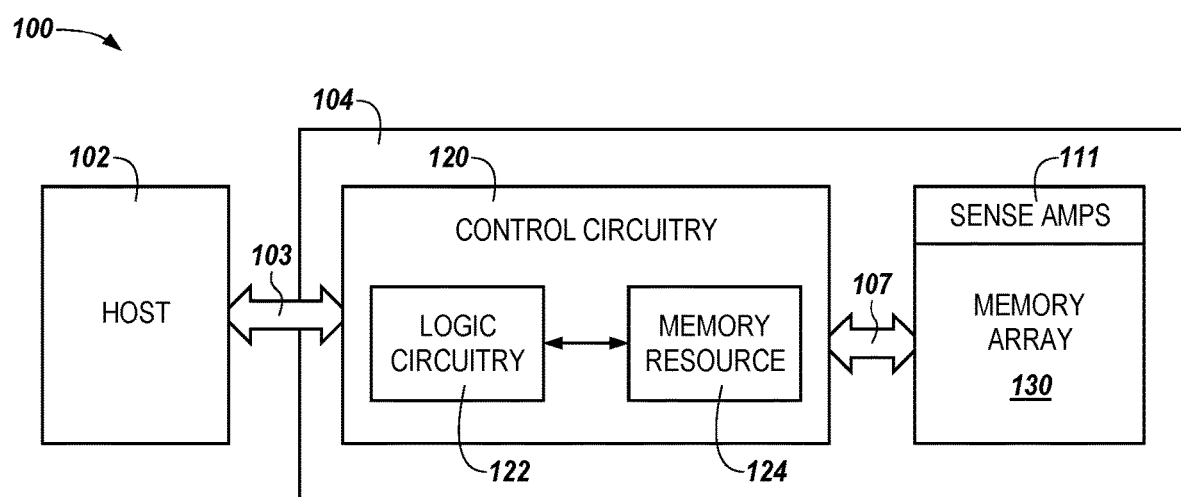
FIG. 1 is a functional block diagram in the form of an apparatus including a host and a memory device in accordance with a number of embodiments of the present disclosure.

Systems, apparatuses, and methods related to bit string accumulation in memory array periphery are described. Control circuitry (e.g., a processing device) may be utilized to control performance of operations using bit strings within a memory device. Results of the operations may be accumulated in circuitry peripheral to a memory array of the memory device. For instance, a plurality of sense amplifiers may be coupled to a memory array and a processing device. A quantity of sense amplifiers among the plurality of sense amplifiers can be the same as a quantity of rows or columns of the array. The processing device may be configured to cause performance of a recursive operation using one or more bit strings that are formatted according to a Type III universal number format or a posit format. The processing device may further be configured to cause resultant bit strings representing results of iterations of the recursive operation to be accumulated in the plurality of sense amplifiers.

Computing systems may perform a wide range of operations that can include various calculations, which can require differing degrees of accuracy. However, computing systems have a finite amount of memory in which to store operands on which calculations are to be performed. In order to facilitate performance of operation on operands stored by a computing system within the constraints imposed by finite memory resources, operands can be stored in particular formats. One such format is referred to as the "floating-point" format, or "float," for simplicity (e.g., the IEEE 754 floating-point format).

Under the floating-point standard, bit strings (e.g., strings of bits that can represent a number), such as binary number strings, are represented in terms of three sets of integers or sets of bits—a set of bits referred to as a "base," a set of bits referred to as an "exponent," and a set of bits referred to as a "mantissa" (or significand). The sets of integers or bits that define the format in which a binary number string is stored may be referred to herein as an "numeric format," or "format," for simplicity. For example, the three sets of integers of bits described above (e.g., the base, exponent, and mantissa) that define a floating-point bit string may be referred to as a format (e.g., a first format). As described in more detail below, a posit bit string may include four sets of integers or sets of bits (e.g., a sign, a regime, an exponent, and a mantissa), which may also be referred to as a "numeric format," or "format," (e.g., a second format). In addition, under the floating-point standard, two infinities (e.g., +∞ and −∞) and/or two kinds of "NaN" (not-a-number): a quiet NaN and a signaling NaN, may be included in a bit string.

The floating-point standard has been used in computing systems for a number of years and defines arithmetic formats, interchange formats, rounding rules, operations, and exception handling for computation carried out by many computing systems. Arithmetic formats can include binary and/or decimal floating-point data, which can include finite numbers, infinities, and/or special NaN values. Interchange formats can include encodings (e.g., bit strings) that may be used to exchange floating-point data. Rounding rules can include a set of properties that may be satisfied when rounding numbers during arithmetic operations and/or conversion operations. Floating-point operations can include arithmetic operations and/or other computational operations such as trigonometric functions. Exception handling can include indications of exceptional conditions, such as division by zero, overflows, etc.

An alternative format to floating-point is referred to as a "universal number" (unum) format. There are several forms of unum formats—Type I unums, Type II unums, and Type III unums, which can be referred to as "posits" and/or "valids." Type I unums are a superset of the IEEE 754 standard floating-point format that use a "ubit" at the end of the mantissa to indicate whether a real number is an exact float, or if it lies in the interval between adjacent floats. The sign, exponent, and mantissa bits in a Type I unum take their definition from the IEEE 754 floating-point format, however, the length of the exponent and mantissa fields of Type I unums can vary dramatically, from a single bit to a maximum user-definable length. By taking the sign, exponent, and mantissa bits from the IEEE 754 standard floating-point format, Type I unums can behave similar to floating-point numbers, however, the variable bit length exhibited in the exponent and fraction bits of the Type I unum can require additional management in comparison to floats.

Type II unums are generally incompatible with floats, however, Type II unums can permit a clean, mathematical design based on projected real numbers. A Type II unum can include n bits and can be described in terms of a "u-lattice" in which quadrants of a circular projection are populated with an ordered set of $2^{n-3}-1$ real numbers. The values of the Type II unum can be reflected about an axis bisecting the circular projection such that positive values lie in an upper right quadrant of the circular projection, while their negative counterparts lie in an upper left quadrant of the circular projection. The lower half of the circular projection representing a Type II unum can include reciprocals of the values that lie in the upper half of the circular projection. Type II unums generally rely on a look-up table for most operations. As a result, the size of the look-up table can limit the efficacy of Type II unums in some circumstances. However, Type II unums can provide improved computational functionality in comparison with floats under some conditions.

The Type III unum format is referred to herein as a "posit format" or, for simplicity, a "posit." In contrast to floating-point bit strings, posits can, under certain conditions, allow for higher precision (e.g., a broader dynamic range, higher resolution, and/or higher accuracy) than floating-point numbers with the same bit width. This can allow for operations performed by a computing system to be performed at a higher rate (e.g., faster) when using posits than with floating-point numbers, which, in turn, can improve the performance of the computing system by, for example, reducing a number of clock cycles used in performing operations thereby reducing processing time and/or power consumed in performing such operations. In addition, the use of posits in computing systems can allow for higher accuracy and/or precision in computations than floating-point numbers, which can further improve the functioning of a computing system in comparison to some approaches (e.g., approaches which rely upon floating-point format bit strings).

Posits can be highly variable in precision and accuracy based on the total quantity of bits and/or the quantity of sets of integers or sets of bits included in the posit. In addition, posits can generate a wide dynamic range. The accuracy, precision, and/or the dynamic range of a posit can be greater than that of a float, or other numerical formats, under certain conditions, as described in more detail herein. The variable accuracy, precision, and/or dynamic range of a posit can be manipulated, for example, based on an application in which a posit will be used. In addition, posits can reduce or eliminate the overflow, underflow, NaN, and/or other corner cases that are associated with floats and other numerical formats. Further, the use of posits can allow for a numerical value (e.g., a number) to be represented using fewer bits in comparison to floats or other numerical formats.

These features can, in some embodiments, allow for posits to be highly reconfigurable, which can provide improved application performance in comparison to approaches that rely on floats or other numerical formats. In addition, these features of posits can provide improved performance in machine learning applications in comparison to floats or other numerical formats. For example, posits can be used in machine learning applications, in which computational performance is paramount, to train a network (e.g., a neural network) with a same or greater accuracy and/or precision than floats or other numerical formats using fewer bits than floats or other numerical formats. In addition, inference operations in machine learning contexts can be achieved using posits with fewer bits (e.g., a smaller bit width) than floats or other numerical formats. By using fewer bits to achieve a same or enhanced outcome in comparison to floats or other numerical formats, the use of posits can therefore reduce an amount of time in performing operations and/or reduce the amount of memory space required in applications, which can improve the overall function of a computing system in which posits are employed.

Embodiments herein are directed to hardware circuitry (e.g., control circuitry) configured to perform various operations on bit strings to improve the overall functioning of a computing device. For example, embodiments herein are directed to hardware circuitry that is configured to perform operations (e.g., recursive operations) using bit strings and/or cause results of the operations to be accumulated (e.g., stored) in peripheral circuitry of a memory device, such as periphery sense amplifiers, extended row address components, etc. As used herein, "periphery sense amplifiers" can include sense amplifiers configured to latch a data value that are located in a periphery (e.g., exterior to) a memory device while "extended row address components" can include multiple latches and/or flip-flops that are located in the periphery of a memory device. Examples of recursive operations that can be performed using the hardware circuitry include arithmetic operations, logical operations, bit-wise operations, vector operations, dot product operations, multiply-accumulate operations, etc. In some embodiments, the bit strings can be formatted in the Type III universal number format or the posit format.

By utilizing peripheral circuitry of a memory device to store results (e.g., exact results) of recursive operations at each iteration, the accuracy of a result of the recursive operation can be improved in comparison to approaches that do not utilize peripheral circuitry of a memory device in such a manner. For example, some approaches provide a small cache or set of registers (e.g., a hidden scratch area) for temporary calculations, such as intermediate results of recursive operations. However, in some approaches, these registers or cache(s) may not be large enough to support storage of exact results of intermediate recursive large bit string operations (e.g., operations using 32-bit or 64-bit bit string operands) without incurring rounding errors due to the size constraints of the registers or cache(s). Even when using smaller vectors for recursive operations (e.g., 8-bit or 16-bit bit string operands), the registers or cache(s) may become overrun depending on the number of iterations used in the recursive operation.

For example, a 64-bit register may be required for operations that use (8,0) posit operands (e.g., a posit bit string with a bit width of 8-bits having no exponent bits) while a 4096-bit register may be required for operations that use (64,4) posit operands (e.g., a posit bit string with a bit width of 64-bits with four exponent bits), which can lead to the register(s) and/or caches of some approaches quickly becoming overrun, especially as the bit width of the bit string operands increase. This can be further exacerbated during the performance of recursive operations in which multiple successive operations are performed using the results from each iteration of the recursive operation.

In some approaches, the small cache or set of registers (e.g., the hidden scratch area) can be "hidden" (e.g., not accessible by a user). In contrast, in some embodiments, access to the peripheral circuitry of the memory device can be provided to a user of the computing system in which the memory device is operating. For example, a user may be provided with the ability to control access to the peripheral circuitry, which can allow for greater control of operations that take advantage of the peripheral circuitry, such as recursive operations. This can allow for greater control of what types of operations are allowed to utilize the peripheral circuitry, can allow for greater control over when recursive operations are terminated, and/or greater control over when a resultant bit string stored in the peripheral circuitry is truncated.

Storing the results of iterations of a recursive operation in peripheral circuitry of a memory device, as described herein, can facilitate improved performance of the computing system by allowing for improved precision and/or accuracy in performed arithmetic and/or logical operations in applications where precision and/or accuracy are desirable. For example, in some embodiments, by providing enough space to store the exact result of each iteration of the recursive operation only the final result of the recursive may be truncated (e.g., rounded) to a desired bit width, as opposed to the truncating of intermediate results of iterations of the recursive operation that is prevalent in some approaches. This can mitigate rounding errors that are often present in some approaches, thereby improving performance of the computing system in which the recursive operations are performed by increasing the accuracy of the results of such recursive operations.

Other embodiments herein are directed to generating and/or storing bit strings (e.g., posit bit strings) in a data structure in a memory array. The bit strings can include posit bit string operands and/or resultant posit bit strings that represent a result of an operation (e.g., an arithmetic and/or logical operation) performed between the posit bit string operands. In some embodiments, a state machine can be included in a memory device to facilitate storing and/or retrieval of the bit strings in or from the memory array. The state machine can be configured to generate certain commands that can include a command to retrieve the bit strings from the memory array and/or cause the bit strings to be transferred out of the array to circuitry external to the memory array. The stored resultant bit strings can be used in the performance of recursive operations, as described in more detail, herein.

By retrieving the bit strings from the memory array using a state machine, performance of a computing device such as the memory device and/or a host coupled to the memory device may be improved in comparison to some approaches. For example, the state machine may require minimal circuitry to perform tasks and operations to store and/or retrieve the bit strings from the memory array, which can reduce an amount of circuitry utilized in some approaches. Further, in embodiments described herein, an amount of processing resources and/or an amount of time consumed in performing operations using the stored bit strings can be reduced in comparison to some approaches because a result of an operation using the bit strings can be stored and retrieved as opposed to approaches in which a calculation is performed using bit string operands each time performance of an operation using the bit strings is invoked.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "N" and "M," etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things.

Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "bit strings," "data," and "data values" are used interchangeably herein and can have the same meaning, as appropriate to the context. In addition, the terms "set of bits," "bit sub-set," and "portion" (in the context of a portion of bits of a bit string) are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 120 may reference element "20" in FIG. 1, and a similar element may be referenced as 220 in FIG. 2. A group or plurality of similar elements or components may generally be referred to herein with a single element number. For example, a plurality of reference elements 433-1, 433-2, . . . , 433-N may be referred to generally as 433. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a functional block diagram in the form of a computing system 100 including an apparatus including a host 102 and a memory device 104 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. The memory device 104 can include a one or more memory modules (e.g., single in-line memory modules, dual in-line memory modules, etc.). The memory device 104 can include volatile memory and/or non-volatile memory. In a number of embodiments, memory device 104 can include a multi-chip device. A multi-chip device can include a number of different memory types and/or memory modules. For example, a memory system can include non-volatile or volatile memory on any type of a module. As shown in FIG. 1, the apparatus 100 can include control circuitry 120, which can include logic circuitry 122 and a memory resource 124, a memory array 130, and sense amplifiers 111 (e.g., the SENSE AMPS 111). In addition, each of the components (e.g., the host 102, the control circuitry 120, the logic circuitry 122, the memory resource 124, and/or the memory array 130) can be separately referred to herein as an "apparatus." The control circuitry 120 may be referred to as a "processing device" herein.

The memory device 104 can provide main memory for the computing system 100 or could be used as additional memory or storage throughout the computing system 100. The memory device 104 can include one or more memory arrays 130 (e.g., arrays of memory cells), which can include volatile and/or non-volatile memory cells. The memory array 130 can be a flash array with a NAND architecture, for example. Embodiments are not limited to a particular type of memory device. For instance, the memory device 104 can include RAM, ROM, DRAM, SDRAM, PCRAM, RRAM, and flash memory, among others.

In embodiments in which the memory device 104 includes non-volatile memory, the memory device 104 can include flash memory devices such as NAND or NOR flash memory devices. Embodiments are not so limited, however, and the memory device 104 can include other non-volatile memory devices such as non-volatile random-access memory devices (e.g., NVRAM, ReRAM, FeRAM, MRAM, PCM), "emerging" memory devices such as 3-D Crosspoint (3D XP) memory devices, etc., or combinations thereof. A 3D XP array of non-volatile memory can perform bit storage based on a change of bulk resistance, in conjunction with a stackable cross-gridded data access array. Additionally, in contrast to many flash-based memories, 3D XP non-volatile memory can perform a write in-place operation, where a non-volatile memory cell can be programmed without the non-volatile memory cell being previously erased.

As illustrated in FIG. 1, a host 102 can be coupled to the memory device 104. In a number of embodiments, the memory device 104 can be coupled to the host 102 via one or more channels (e.g., channel 103). In FIG. 1, the memory device 104 is coupled to the host 102 via channel 103 and acceleration circuitry 120 of the memory device 104 is coupled to the memory array 130 via a channel 107. The host 102 can be a host system such as a personal laptop computer, a desktop computer, a digital camera, a smart phone, a memory card reader, and/or an internet-of-things (IoT) enabled device, among various other types of hosts.

The host 102 can include a system motherboard and/or backplane and can include a memory access device, e.g., a processor (or processing device). One of ordinary skill in the art will appreciate that "a processor" can intend one or more processors, such as a parallel processing system, a number of coprocessors, etc. The system 100 can include separate integrated circuits or both the host 102, the memory device 104, and the memory array 130 can be on the same integrated circuit. The system 100 can be, for instance, a server system and/or a high-performance computing (HPC) system and/or a portion thereof. Although the example shown in FIG. 1 illustrate a system having a Von Neumann architecture, embodiments of the present disclosure can be implemented in non-Von Neumann architectures, which may not include one or more components (e.g., CPU, ALU, etc.) often associated with a Von Neumann architecture The memory device 104, which is shown in more detail in FIG. 2, herein, can include acceleration circuitry 120, which can include logic circuitry 122 and a memory resource 124. The logic circuitry 122 can be provided in the form of an integrated circuit, such as an application-specific integrated circuit (ASIC), field programmable gate array (FPGA), reduced instruction set computing device (RISC), advanced RISC machine, system-on-a-chip, or other combination of hardware and/or circuitry that is configured to perform operations described in more detail, herein. For example, the logic circuitry 122 can perform recursive operations on bit strings stored by the memory resource 124 and/or cause the result of one or more iterations of the recursive operation to be stored in the sense amps 111.

In some embodiments, the operations can further include conversion operations to convert floating-point bit strings (e.g., floating-point numbers) to bit strings in a posit format, and vice versa. Once the floating-point bit strings are converted to bit strings in the posit format, the logic circuitry 122 can be configured to perform (or cause performance of) recursive arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or recursive logical operations such as AND, OR, XOR, NOT, etc., as well as trigonometric operations such as sine, cosine, tangent, etc. using the posit bit strings. As will be appreciated, the foregoing list of operations is not intended to be exhaustive, nor is the foregoing list of operations intended to be limiting, and the logic circuitry 122 may be configured to perform (or cause performance of) other arithmetic and/or logical operations.

The control circuitry 120 can further include a memory resource 124, which can be communicatively coupled to the logic circuitry 122. The memory resource 124 can include volatile memory resource, non-volatile memory resources, or a combination of volatile and non-volatile memory resources. In some embodiments, the memory resource can be a random-access memory (RAM) such as static random-access memory (SRAM). Embodiments are not so limited, however, and the memory resource can be a cache, one or more registers, NVRAM, ReRAM, FeRAM, MRAM, PCM), "emerging" memory devices such as 3-D Crosspoint (3D XP) memory devices, etc., or combinations thereof.

The memory resource 124 can store one or more bit strings. In some embodiments, the bit string(s) stored by the memory resource 124 can be stored according to a universal number (unum) or posit format. As used herein, the bit string stored in the unum (e.g., a Type III unum) or posit format can include several sub-sets of bits or "bit sub-sets." For example, a universal number or posit bit string can include a bit sub-set referred to as a "sign" or "sign portion," a bit sub-set referred to as a "regime" or "regime portion," a bit sub-set referred to as an "exponent" or "exponent portion,"

and a bit-subset referred to as a "mantissa" or "mantissa portion" (or significand). As used herein, a bit sub-set is intended to refer to a sub-set of bits included in a bit string. Examples of the sign, regime, exponent, and mantissa sets of bits are described in more detail in connection with FIGS. 3 and 4A-4B, herein. Embodiments are not so limited, however, and the memory resource can store bit strings in other formats, such as the floating-point format, or other suitable formats.

For example, in some embodiments, the memory resource 124 can receive data comprising a bit string having a first format that provides a first level of precision. The logic circuitry 122 can receive the data from the memory resource and convert the bit string to a second format that provides a second level of precision that is different from the first level of precision. The first level of precision can, in some embodiments, be lower than the second level of precision. For example, if the first format is a floating-point format and the second format is a universal number or posit format, the floating-point bit string may provide a lower level of precision under certain conditions than the universal number or posit bit string, as described in more detail in connection with FIGS. 3 and 4A-4B, herein.

The first format can be a floating-point format (e.g., an IEEE 754 format) and the second format can be a universal number (unum) format (e.g., a Type I unum format, a Type II unum format, a Type III unum format, a posit format, a valid format, etc.). As a result, the first format can include a mantissa, a base, and an exponent portion, and the second format can include a mantissa, a sign, a regime, and an exponent portion.

The logic circuitry 122 can be configured to cause performance of an arithmetic operation or a logical operation, or both, using the bit string having the second format (e.g., a unum or posit format). In some embodiments, the arithmetic operation and/or the logical operation can be a recursive operation. As used herein, a "recursive operation" generally refers to an operation that is performed a specified quantity of times where a result of a previous iteration of the recursive operation is used an operand for a subsequent iteration of the operation. For example, a recursive multiplication operation can be an operation in which two bit string operands, β and φ are multiplied together and the result of each iteration of the recursive operation is used as a bit string operand for a subsequent iteration. Stated alternatively, a recursive operation can refer to an operation in which a first iteration of the recursive operation includes multiplying β and φ together to arrive at a result λ (e.g., β×φ=λ). The next iteration of this example recursive operation can include multiplying the result λ by φ to arrive at another result w (e.g., λ×φ=ω).

Another illustrative example of a recursive operation can be explained in terms of calculating the factorial of a natural number. This example, which is given by Equation 1 can include performing recursive operations when the factorial of a given number, n, is greater than zero and returning unity if the number n is equal to zero:

$$\text{fact}(n) = \begin{cases} 1 & \text{if } n = 0 \\ n \times \text{fact}(n-1) & \text{if } n > 0 \end{cases} \quad \text{Equation 1}$$

As shown in Equation 1, a recursive operation to determine the factorial of the number n can be carried out until n is equal to zero, at which point the solution is reached and the recursive operation is terminated. For example, using Equation 1, the factorial of the number n can be calculated recursively by performing the following operations: n×(n−1)×(n−2)× . . . ×1.

Yet another example of a recursive operation is a multiply-accumulate operation in which an accumulator, a is modified at iteration according to the equation a←a+(b×c). In a multiply-accumulate operation, each previous iteration of the accumulator a is summed with the multiplicative product of two operands b and c. In some approaches, multiply-accumulate operations may be performed with one or more roundings (e.g., a may be truncated at one or more iterations of the operation). However, in contrast, embodiments herein can allow for a multiply-accumulate operation to be performed without rounding the result of intermediate iterations of the operation, thereby preserving the accuracy of each iteration until the final result of the multiply-accumulate operation is completed.

Examples of recursive operations contemplated herein are not limited to these examples. To the contrary, the above examples of recursive operations are merely illustrative and are provided to clarify the scope of the term "recursive operation" in the context of the disclosure.

As shown in FIG. 1, a plurality of sense amplifiers (e.g., the sense amps 111) are coupled to a memory array 130 and the control circuitry 120. The control circuitry 120 can be configured to cause performance of a recursive operation using one or more bit strings and/or cause resultant bit strings representing results of iterations of the recursive operation to be stored (e.g., accumulated) in the plurality of sense amplifiers. In some embodiments, the operation to cause the resultant bit strings to be accumulated in the plurality of sense amplifiers is performed in response to receipt of a user generated command. Embodiments are not so limited, however, and in some embodiments, the control circuitry 120 can be configured to perform the operation to cause the resultant bit strings to be accumulated in the plurality of sense amplifiers in response to receipt of a host command or in response to a determination that the bit strings to be used in the recursive operation are stored in the memory resource 124 of the control circuitry 120. As described in more detail, herein, the one or more bit strings, the resultant bit string, or both, can be formatted according to a Type III universal number format or a posit format.

The sense amps 111 can provide additional storage space for the memory array 130 and can sense (e.g., read, store, cache) data values that are present in the memory device 104. In some embodiments, the sense amps 111 can be located in a periphery area of the memory device 104. For example, the sense amps 111 can be located in an area of the memory device 104 that is physically distinct from the memory array 130. The sense amps 111 can include sense amplifiers, latches, flip-flops, etc. that can be configured to stored data values, as described herein. In some embodiments, the sense amps 111 can be provided in the form of a register or series of registers and can include a same quantity of storage locations (e.g., sense amplifiers, latches, etc.) as there are rows or columns of the memory array 130. For example, if the memory array 130 contains around 16K rows or columns, the periphery sense amplifiers 111 can include around 16K storage locations. Accordingly, in some embodiments, the periphery sense amplifiers 111 can be a register that is configured to hold up to 16K data values, although embodiments are not so limited as described n more detail in connection with FIG. 2A.

The control circuitry 120 can be further configured to cause resultant bit strings representing results of iterations of the recursive operation to be accumulated in the plurality of sense amplifiers (e.g., the sense amps 111) by overwriting a previously stored resultant bit string in the plurality of sense amplifiers. For example, the control circuitry 120 can be configured to store each successive intermediate resultant bit string of the recursive operation to be stored in a same location as the preceding intermediate bit string is stored. However, as described in more detail below in connection with FIGS. 2A and 2B, successive iterations of the recursive operation may have larger bit widths than preceding iterations of the recursive operation. In this case, the control circuitry 120 can be configured to overwrite the preceding resultant bit string and store additional bits of a subsequent bit string representing a subsequent iteration in additional sense amps 111.

In some embodiments, the control circuitry 120 can be configured to determine that the recursive operation is complete and cause performance of an operation to round the resultant bit string stored in the plurality of sense amplifiers subsequent to the determination such that the final resultant bit string has a particular bit width by removing at least one bit from a mantissa bit sub-set or an exponent bit sub-set of the resultant bit string, or both. For example, once the recursive operation is complete, the control circuitry 120 can cause the final result of the operation to be rounded to a bit width that can be transferred to circuitry external to the sense amps 111.

The final result of the recursive operation can be rounded to a particular bit width, such as 8-bits, 16-bits, 32-bits, 64-bits, etc. The particular bit width at which the final result of the recursive operation can be predetermined, or can be selectable by, for example, a user input. For example, in some embodiments, a user can provide a command to the control circuitry 120 that instructs the control circuitry 120 to round the final result of the recursive operation to a desired bit width.

In some embodiments, the recursive operation can be performed within the memory array 130 without transferring the resultant bit strings to circuitry external to the memory device 104. For example, the recursive operation can be performed by the logic circuitry 122 of the control circuitry, or by firing rows and columns of the memory array in a particular combination to perform the recursive operation.

The control circuitry 120 can, in some embodiments, be configured to access an address space of the memory array in which a first resultant bit string that represents a result of a first iteration of the recursive operation is stored and/or access an address space of the memory array 130 in which a second resultant bit string that represents a result of a second iteration of the recursive operation is stored. The control circuitry 120 can be further configured to store a bit string representing a result of an operation performed using the first resultant bit string and the second resultant bit string in the plurality of sense amplifiers (e.g., in the sense amps 111).

In some embodiments, the control circuitry 120 can be configured to execute a specified set of instructions to, for example, write, read, copy, and/or erase bit strings (e.g., data) stored in the memory array 130. For example, as described in more detail, herein, the control circuitry 120 can execute instructions to read data from one or more rows and/or columns of the memory array 130 to retrieve data stored in the memory array 130. As described in more detail in connection with FIGS. 2A, 2B, and 5, inter alia, the data can include one or more posit bit string operands and/or one or more results of operations (e.g., arithmetic and/or logical operations), performed between the posit bit string operands and stored in the memory array 130.

By utilizing control circuitry 120 configured to execute a specified set of instructions to write and/or retrieve posit bit strings from the memory array 130, improved memory device 104 performance may be realized in comparison to some approaches since an amount of time consuming and/or computing resource intensive processes to perform operations between posit bit strings stored in the memory array 130 may be reduced by storing the result(s) of such operations in the memory array 130 and retrieving the result(s) of the operations directly from the memory array 130.

In some embodiments, the control circuitry 120 can determine an address in the memory array 130 in which a relevant posit bit string is stored. For example, the control circuitry 120 can determine a row and/or column address in the memory array 130 in which one or more posit bit string operands are stored and/or a row and/or column address in which a resultant posit bit string that represents performance of an arithmetic and/or logical operation between the one or more posit bit string operands are stored. The control circuitry 120 can then send a command or request to retrieve the posit bit string(s) that are stored at the addresses in the memory array 130 and/or cause the retrieved posit bit string(s) to be transferred to the sense amps 111, the host 102, a media device (e.g., a solid-state drive, flash memory device, etc.) coupled to the memory device 102, or to other circuitry external to the memory array 130 as, for example, part of performance of a recursive operation using the stored bit strings.

The embodiment of FIG. 1 can include additional circuitry that is not illustrated so as not to obscure embodiments of the present disclosure. For example, the memory device 104 can include address circuitry to latch address signals provided over I/O connections through I/O circuitry. Address signals can be received and decoded by a row decoder and a column decoder to access the memory device 104 and/or the memory array 130. It will be appreciated by those skilled in the art that the number of address input connections can depend on the density and architecture of the memory device 104 and/or the memory array 130.

Figure 2A:
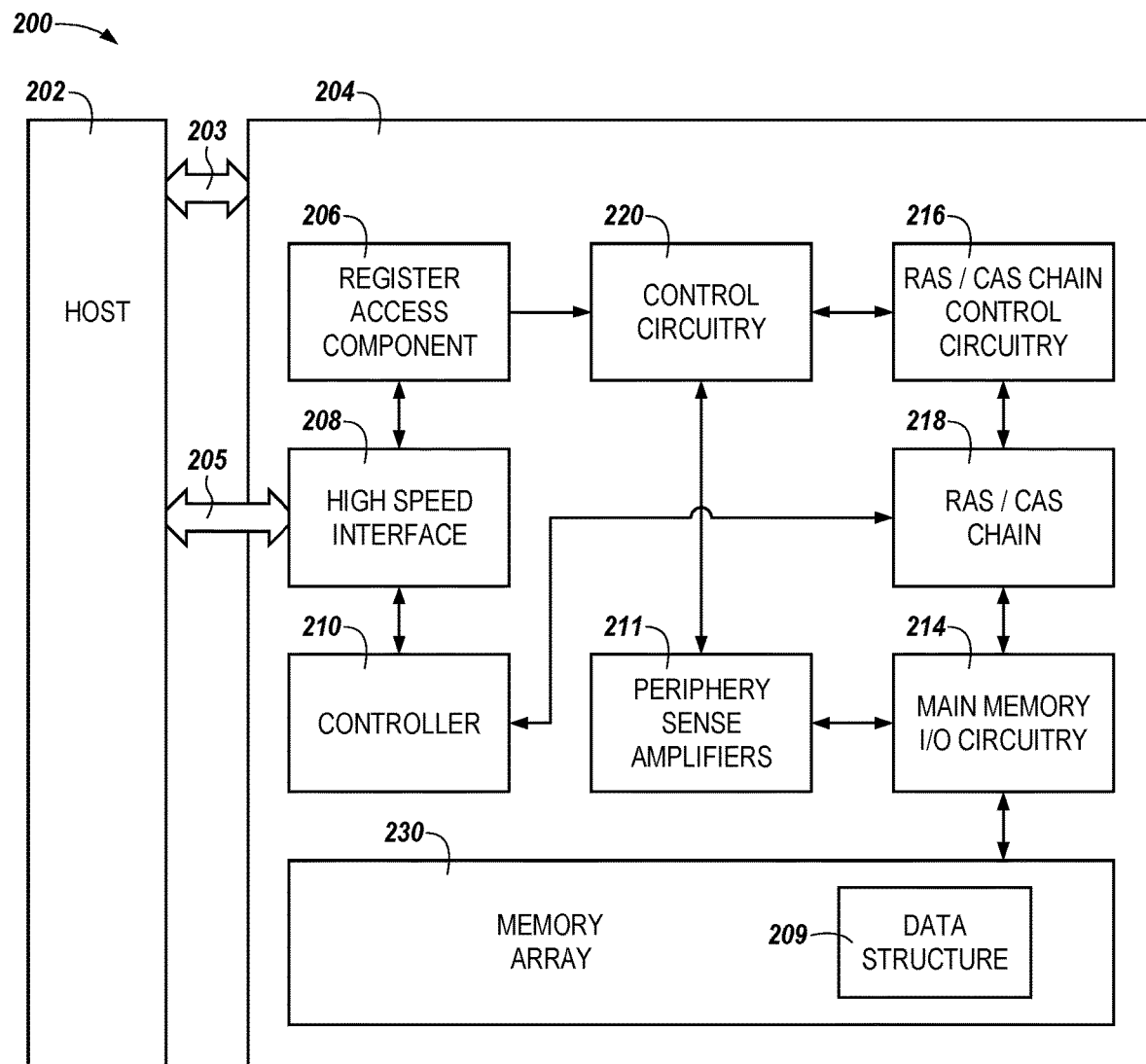
FIG. 2A is a functional block diagram in the form of a computing system including an apparatus including a host and a memory device in accordance with a number of embodiments of the present disclosure.

FIG. 2A is a functional block diagram in the form of a computing system including an apparatus 200 including a host 202 and a memory device 204 in accordance with a number of embodiments of the present disclosure. The memory device 204 can include control circuitry 220, which can be analogous to the control circuitry 120 illustrated in FIG. 1. Similarly, the host 202 can be analogous to the host 102 illustrated in FIG. 1, and the memory device 204 can be analogous to the memory device 104 illustrated in FIG. 1. Each of the components (e.g., the host 202, the bit string conversion circuitry 220, the logic circuitry 222, the memory resource 224, and/or the memory array 230, etc.) can be separately referred to herein as an "apparatus."

The host 202 can be communicatively coupled to the memory device 204 via one or more channels 203, 205. The channels 203, 205 can be interfaces or other physical connections that allow for data and/or commands to be transferred between the host 202 and the memory device 205. For example, commands to cause initiation of an operation (e.g., an operation to initiate a recursive operation using one or more bit strings, an operation to store a result of an iteration of the recursive operation in the periphery sense amplifiers 211) to be performed using the control circuitry 220 can be transferred from the host via the channels 203, 205. It is noted that, in some embodiments, the control circuitry 220 can perform the operations in response to an initiation command transferred from the host 202 via one or more of the channels 203, 205 in the absence of an intervening command from the host 202. That is, once the control circuitry 220 has received the command to initiate performance of an operation from the host 202, the operations can be performed by the control circuitry 220 in the absence of additional commands from the host 202.

As shown in FIG. 2A, the memory device 204 can include a register access component 206, a high speed interface (HSI) 208, a controller 210, periphery sense amplifiers 211, which can include one or more extended row address (XRA) component(s), main memory input/output (I/O) circuitry 214, row address strobe (RAS)/column address strobe (CAS) chain control circuitry 216, a RAS/CAS chain component 218, control circuitry 220, and a memory array 230. The periphery sense amplifiers 211 and/or the control circuitry 220 are, as shown in FIG. 2, located in an area of the memory device 204 that is physically distinct from the memory array 230. That is, in some embodiments, the periphery sense amplifiers 211 and/or the control circuitry 220 are located in a periphery location of the memory array 230.

The register access component 206 can facilitate transferring and fetching of data from the host 202 to the memory device 204 and from the memory device 204 to the host 202. For example, the register access component 206 can store addresses (or facilitate lookup of addresses), such as memory addresses, that correspond to data that is to be transferred to the host 202 from the memory device 204 or transferred from the host 202 to the memory device 204. In some embodiments, the register access component 206 can facilitate transferring and fetching data that is to be operated upon by the bit string conversion circuitry 220 and/or the register access component 206 can facilitate transferring and fetching data that is has been operated upon by the control circuitry 220, or in response to an action taken by the control circuitry 220, for transfer to the host 202.

The HSI 208 can provide an interface between the host 202 and the memory device 204 for commands and/or data traversing the channel 205. The HSI 208 can be a double data rate (DDR) interface such as a DDR3, DDR4, DDR5, etc. interface. Embodiments are not limited to a DDR interface, however, and the HSI 208 can be a quad data rate (QDR) interface, peripheral component interconnect (PCI) interface (e.g., a peripheral component interconnect express (PCIe)) interface, or other suitable interface for transferring commands and/or data between the host 202 and the memory device 204.

The controller 210 can be responsible for executing instructions from the host 202 and accessing the control circuitry 220 and/or the memory array 230. The controller 210 can be a state machine, a sequencer, or some other type of controller. The controller 210 can receive commands from the host 202 (via the HSI 208, for example) and, based on the received commands, control operation of the control circuitry 220 and/or the memory array 230. In some embodiments, the controller 210 can receive a command from the host 202 to cause performance of an operation using the control circuitry 220. Responsive to receipt of such a command, the controller 210 can instruct the control circuitry 220 to begin performance of the operation(s).

In a non-limiting example, the controller 210 can instruct the control circuitry 220 to perform an operation to retrieve one or more bit strings stored in the memory array 230 and/or a resultant bit string stored in the memory array 230 that represents a result of an operation performed between the one or more bit strings. For example, the controller 210 can receive a command from the host 204 requesting performance of an operation between one or more bit strings and send a command to the control circuitry 220 to perform the operation. The control circuitry 220 can determine if a result of the requested operation is stored in the memory array 230, determine an address in the memory array 230 at which the result of the requested operation is stored, and/or retrieve the result of the requested operation from the memory array 230. The control circuitry 220 and/or the controller 210 can then cause the result of the requested operation to be transferred to the periphery sense amplifier 211, the data structure 209, the host 202 or to other circuitry external to the memory array 230

In some embodiments, the controller 210 can be a global processing controller and may provide power management functions to the memory device 204. Power management functions can include control over power consumed by the memory device 204 and/or the memory array 230. For example, the controller 210 can control power provided to various banks of the memory array 230 to control which banks of the memory array 230 are operational at different times during operation of the memory device 204. This can include shutting certain banks of the memory array 230 down while providing power to other banks of the memory array 230 to optimize power consumption of the memory device 230. In some embodiments, the controller 210 controlling power consumption of the memory device 204 can include controlling power to various cores of the memory device 204 and/or to the control circuitry 220, the memory array 230, etc.

As mentioned above, the peripheral sense amplifiers 211 can provide additional storage space for the memory array 230 and can sense (e.g., read, store, cache) data values that are present in the memory device 204. The periphery sense amplifiers 211 can include sense amplifiers, latches, flip-flops, extended row address (XRA) component(s), etc. that can be configured to store data values (e.g., bit strings), as described herein. As shown in FIG. 2A, the peripheral sense amplifiers 211 are in a location of the memory device 204 that is physically distinct from the memory array 230. In some embodiments, the peripheral sense amplifiers 211 can be provided in the form of a register or series of registers and can include a same quantity of storage locations (e.g., sense amplifiers, latches, etc.) as there are rows or columns of the memory array 230. For example, if the memory array 230 contains around 16K rows or columns, the periphery sense amplifiers 211 can include around 16K storage locations. Accordingly, in some embodiments, the periphery sense amplifiers 211 can be a register that is configured to hold up to around 16K data values.

However, embodiments are not limited to scenarios in which the periphery sense amplifiers 211 include around 16K location in which to store data values. For example, the periphery sense amplifiers 211 can be configured to store around 2K data values, around 4K data values, around 8K data values, etc. Further, although a single box is shown as illustrating the peripheral sense amplifiers 211 in FIG. 2A, in some embodiments there can be more that a single "row" of peripheral sense amplifiers 211. For example, there may be two, four, or eight, among other quantities, of "rows" of peripheral sense amplifiers 211 that can each be configured to store around 2K data values, around 4K data values, around 8K data values, around 16K data values, etc.

As described above, in some embodiments, the periphery sense amplifiers 211 can be configured to store intermediate results of recursive operations performed using bit strings. In some embodiments, the intermediate results of the recursive operations can represent a result generated at each iteration of the recursive operation. In contrast to some approaches, because the periphery sense amplifiers 211 can be configured to store up to 16K data values, the intermediate results of the recursive operations may not to be rounded (e.g. truncated) during performance of the recursive operation.

Instead, in some embodiments, a final result of the recursive operation that is stored in the periphery sense amplifiers upon completion of the recursive operation may be rounded to a desired bit width (e.g., 8-bits, 16-bits, 32-bits, 64-bits, etc.). This can improve the accuracy of the result of the recursive operation, because, in contrast to approaches that do not utilize the periphery sense amplifiers 211 to store the intermediate results of the recursive operation, intermediate results of the recursive may not need to be rounded before the final result of the recursive operation is computed.

The periphery sense amplifiers 211 can be configured to overwrite previously stored intermediate results of the recursive operation when a new iteration of the recursive operation is completed. For example, a result that represents the first iteration of a recursive operation can be stored in the periphery sense amplifiers 211 once the first iteration of the recursive operation is complete. Once a result that represents a second iteration of the recursive operation is completed, the result of the second iteration of the recursive operation can be stored in the periphery sense amplifier 211. Similarly, once a result that represents a third iteration of the recursive operation is completed, the result of the third iteration of the recursive operation can be stored in the periphery sense amplifier 211. In some embodiments, the result of each subsequent iteration can be stored in the periphery sense amplifiers 211 by overwriting the stored result of the previous iteration.

Depending on the bit width of the result of each iteration, subsequent bit strings that represent the result of each iteration and are stored in the periphery sense amplifiers 211 may be stored using more sense amplifiers in the periphery sense amplifiers 211 than preceding stored bit strings. For example, the result of the first iteration may contain a first quantity of bits and the result of the second iteration may contain a second quantity of bits that is greater than the first quantity of bits. When the result of the second iteration is written to or stored by the periphery sense amplifiers 211, it may be stored such that the result of the first iteration is overwritten, however, because the result of the second iteration may contain more bits that the result of the first iteration, in some embodiments, additional sense amplifiers of the periphery sense amplifiers 211 may be used to store the result of the second iteration in addition to the sense amplifiers that were used to store the result of the first iteration.

In a simplified, non-limiting example in which the recursive operation comprises a recursive multiplication operation in which a number 2.51 is recursively multiplied with a number 3.73, the result of the first iteration may be 9.3623. In this example, the result of the first iteration includes five bits and can be stored, for example, in five sense amplifiers in the periphery sense amplifiers 211. The result of the second iteration (e.g., the result of multiplication between the first result 9.3623 and 3.73) can be 34.921379, which includes eight bits. In some embodiments, the result of the second iteration can be stored in eight sense amplifiers of the periphery sense amplifiers 211 by, for example, overwriting the result of the first iteration that are stored in five sense amplifiers and writing the additional three bits to three other sense amplifiers in the periphery sense amplifiers 211. The results of subsequent iterations of the recursive operation can similarly be stored in the periphery sense amplifiers 211 such that the result of the preceding iteration is overwritten. Embodiments are not so limited, however, and in some embodiments, the results of each iteration can be stored in adjacent sense amplifiers in the periphery sense amplifiers 211, or in particular sense amplifiers of the periphery sense amplifiers 211.

In some embodiments, access to the periphery sense amplifiers 211 can be controlled using a register mapping. For example, bit strings can be stored in the periphery sense amplifiers 211, deleted from the periphery sense amplifiers 211, and/or the bit width of bit strings stored in the periphery sense amplifiers 211 can be altered in response to commands associated with a registry mapping that can be stored in the control circuitry 220. In addition, bit strings stored in the memory array 230 (e.g., in the data structure 209 of the memory array 230) can be added to or subtracted from (e.g., accumulated with) bit strings stored in the periphery sense amplifiers 211 in response to commands associated with the control circuitry 220.

The control circuitry 220 can also include commands associated with converting results of operations performed as part of a recursive operation using posit bit strings between the posit format and formats that can be stored in the periphery sense amplifiers 211 and/or the memory array 230, as described in more detail in connection with FIG. 6, herein. For example, the control circuitry 220 can include one or more registers that can include commands associated with causing a posit bit string to be represented in terms of a sign bit, mantissa bits, exponent bits, and a k-value, which can be used to expand a bit string such that it is represented in the posit format.

The main memory input/output (I/O) circuitry 214 can facilitate transfer of data and/or commands to and from the memory array 230. For example, the main memory I/O circuitry 214 can facilitate transfer of bit strings, data, and/or commands from the host 202 and/or the bit string conversion circuitry 220 to and from the memory array 230. In some embodiments, the main memory I/O circuitry 214 can include one or more direct memory access (DMA) components that can transfer the bit strings (e.g., posit bit strings stored as blocks of data) from the control circuitry 220 to the memory array 230, and vice versa.

In some embodiments, the main memory I/O circuitry 214 can facilitate transfer of bit strings, data, and/or commands from the memory array 230 to the control circuitry 220 so that the control circuitry 220 can perform operations on the bit strings. Similarly, the main memory I/O circuitry 214 can facilitate transfer of bit strings that have had one or more operations performed on them by the control circuitry 220 to the memory array 230. As described in more detail herein, the operations can include recursive operations performed using bit string (e.g., unum or posit bit strings) in which results of intermediate iterations are stored in the periphery sense amplifiers 211.

As described above, posit bit strings (e.g., the data) can be stored and/or retrieved from the memory array 230. In some embodiments, the main memory I/O circuitry 214 can facilitate storing and/or retrieval of the posit bit strings to and/or from the memory array 230. For example, the main memory I/O circuitry 214 can be enabled to transfer posit bit strings to the memory array 230 to be stored, and/or the main memory I/O circuitry 214 can facilitate retrieval of the posit bit strings (e.g., posit bit strings representing a performed operation between one or more posit bit string operands) from the memory array 230 in response to, for example, a command from the controller 210 and/or the control circuitry 220.

The row address strobe (RAS)/column address strobe (CAS) chain control circuitry 216 and the RAS/CAS chain component 218 can be used in conjunction with the memory array 230 to latch a row address and/or a column address to initiate a memory cycle. In some embodiments, the RAS/CAS chain control circuitry 216 and/or the RAS/CAS chain component 218 can resolve row and/or column addresses of the memory array 230 at which read and write operations associated with the memory array 230 are to be initiated or terminated. For example, upon completion of an operation using the control circuitry 220, the RAS/CAS chain control circuitry 216 and/or the RAS/CAS chain component 218 can latch and/or resolve a specific location in the periphery sense amplifiers 211 and/or the memory array 230 to which the bit strings that have been operated upon by the control circuitry 220 are to be stored. Similarly, the RAS/CAS chain control circuitry 216 and/or the RAS/CAS chain component 218 can latch and/or resolve a specific location in the periphery sense amplifiers 211 and/or the memory array 230 from which bit strings are to be transferred to the control circuitry 220 prior to, or subsequent to, the control circuitry 220 performing an operation (e.g., a recursive operation) on the bit string(s).

The control circuitry 220 can include logic circuitry (e.g., the logic circuitry 122 illustrated in FIG. 1) and/or memory resource(s) (e.g., the memory resource 124 illustrated in FIG. 1). Bit strings (e.g., data, a plurality of bits, etc.) can be received by the control circuitry 220 from, for example, the host 202, the memory array 230, and/or an external memory device and stored by the control circuitry 220, for example in the memory resource of the control circuitry 220. The control circuitry (e.g., the logic circuitry 222 of the control circuitry 220) can perform operations (or cause operations to be performed) on the bit string(s) and cause intermediate results of the operations to be stored in the periphery sense amplifiers 211. As described above, in some embodiments, the bit string(s) can be formatted in a unum or posit format.

As described in more detail in connection with FIGS. 3 and 4A-4B, universal numbers and posits can provide improved accuracy and may require less storage space (e.g., may contain a smaller number of bits) than corresponding bit strings represented in the floating-point format. For example, a numerical value represented by a floating-point number can be represented by a posit with a smaller bit width than that of the corresponding floating-point number. Accordingly, by performing operations (e.g., arithmetic operations, logical operations, bit-wise operations, vector operations, etc.) using posit bit strings, performance of the memory device 204 may be improved in comparison to approaches that utilize only floating-point bit strings because subsequent operations (e.g., arithmetic and/or logical operations) may be performed more quickly on the posit bit strings (e.g., because the data in the posit format is smaller and therefore requires less time to perform operations on). Further, performance of the memory device 204 may be improved in comparison to approaches that utilize only floating-point bit strings because less memory space is required in the memory device 202 to store the bit strings in the posit format, which can free up additional space in the memory device 202 for other bit strings, data, and/or other operations to be performed.

In some embodiments, the control circuitry 220 can perform (or cause performance of) recursive arithmetic and/or logical operations on the posit bit strings. For example, the control circuitry 220 can be configured to perform (or cause performance of) recursive arithmetic operations such as recursive additions, recursive subtractions, recursive multiplications, recursive divisions, fused multiply addition operations, multiply-accumulate operations, recursive dot product operations, greater than or less than, absolute value (e.g., FABS( )), fast Fourier transforms, inverse fast Fourier transforms, sigmoid function operations, convolution operations, recursive square root operations, recursive exponent operations, and/or recursive logarithm operations, and/or recursive logical operations such as AND, OR, XOR, NOT, etc., as well as recursive trigonometric operations such as sine, cosine, tangent, etc. As will be appreciated, the foregoing list of operations is not intended to be exhaustive, nor is the foregoing list of operations intended to be limiting, and the control circuitry 220 may be configured to perform (or cause performance of) other arithmetic and/or logical operations using posit bit strings.

In some embodiments, the control circuitry 220 may perform the above-listed operations in conjunction with execution of one or more machine learning algorithms. For example, the control circuitry 220 may perform operations related to one or more neural networks. Neural networks may allow for an algorithm to be trained over time to determine an output response based on input signals. For example, over time, a neural network may essentially learn to better maximize the chance of completing a particular goal. This may be advantageous in machine learning applications because the neural network may be trained over time with new data to achieve better maximization of the chance of completing the particular goal. A neural network may be trained over time to improve operation of particular tasks and/or particular goals. However, in some approaches, machine learning (e.g., neural network training) may be processing intensive (e.g., may consume large amounts of computer processing resources) and/or may be time intensive (e.g., may require lengthy calculations that consume multiple cycles to be performed).

In contrast, by performing such operations using the control circuitry 220, for example, by performing such operations on bit strings in the posit format, the amount of processing resources and/or the amount of time consumed in performing the operations may be reduced in comparison to approaches in which such operations are performed using bit strings in a floating-point format. Further, by storing intermediate results of the recursive operations in the periphery sense amplifiers 211, the accuracy of a bit string that represents the final result of the recursive operation may be higher in comparison to approaches that truncate intermediate results of recursive operations or in approaches in which intermediate results of recursive operations are stored in a hidden scratch area.

In some embodiments, the controller 210 can be configured to cause the control circuitry 220 to perform operations using bit strings without encumbering the host 202 (e.g., without receiving an intervening command or a command separate from a command to initiate performance of the operation from the host 202 and/or without transferring results of the operations to the host 202). Embodiments are not so limited, however, and in some embodiments, the controller 210 can be configured to cause the control circuitry 220 (e.g., the logic circuitry) to perform recursive arithmetic and/or recursive logical operations using bit strings, store intermediate results of such operations in the periphery sense amplifiers 211 and/or round the final result of the recursive operation (which may be stored in the periphery sense amplifiers 211 and/or the XRA component(s)) such that the final result of the recursive operation has a particular bit width associated therewith.

For example, the control circuitry 220 can be configured to cause performance of a recursive operation using the one or more bit strings and/or cause successive resultant bit strings that each represent a result of a corresponding iteration of the recursive operation to be accumulated (e.g., stored) in the periphery sense amplifiers 211 (e.g., a plurality of sense amplifiers). In some embodiments, the control circuitry 220 can be further configured to cause each successive resultant bit string to be accumulated in the plurality of sense amplifiers 211 by overwriting a preceding resultant bit string stored in the plurality of sense amplifiers 211, as described below.

The one or more bit strings, the resultant bit string, or both, can formatted according to a Type III universal number format or a posit format. Further, as described above, the periphery sense amplifiers 211 can be located in a periphery of the memory array 230. That is, in some embodiments, the periphery sense amplifiers 211 can be located in an area of the memory device 204 that is physically distinct from an area in which the memory array 230 is located.

In some embodiments, the performance of the recursive operation can include performing an arithmetic operation, a logical operation, a bit-wise operation, a vector operation, or combinations thereof. In response to a determination that the recursive operation is completed, the control circuitry 220 can be configured to cause a last resultant bit string stored in the plurality of sense amplifiers 211 to be rounded (e.g., truncated) such that the last resultant bit string has a particular bit width. For example, the control circuitry 220 can cause the last resultant bit string stored in the plurality of sense amplifiers 211 to be rounded off to have a bit width of 8-bits, 16-bits, 32-bits, 64-bits, etc. In some embodiments, the control circuitry 220 can be configured to cause at least one bit from a mantissa bit sub-set or an exponent bit sub-set (which are described n more detail in connection with FIGS. 3, 4A, and 4B, herein) of the last resultant bit string to be deleted to truncate the last resultant bit string to the particular bit width.

As described above in connection with FIG. 1, the memory array 230 can be a DRAM array, SRAM array, STT RAM array, PCRAM array, TRAM array, RRAM array, NAND flash array, and/or NOR flash array, for instance, although embodiments are not limited to these particular examples. The memory array 230 can function as main memory for the computing system 200 shown in FIGS. 2A and 2B. In some embodiments, the memory array 230 can be configured to store bit strings operated on by the control circuitry 220 (e.g., bit strings that represent a final result of a performed recursive operation) and/or store bit strings to be transferred to the control circuitry 220 prior to performance of operations using the bit strings.

In some embodiments, bit strings (e.g., posit bit strings) can be generated and/or stored in the memory array 230 without encumbering the host 202. For example, the bit strings can be generated and/or stored in the memory array 230 without receiving multiple commands from the host 202. Stated alternatively, in some embodiments, the host 202 can send a single command to the memory device to request performance of an operation using one or more bit strings. Responsive to receipt of the command to request performance of the operation, the memory device 204 (e.g., the controller 210, the control circuitry 220, or other components of the memory device 204) can perform the operation and/or retrieve a stored result of the operation in the absence of additional commands from the host 202. This can reduce traffic across the channels 203/205, which can increase performance of a computing device associated with the host 202 and/or the memory device 204.

As shown in FIG. 2A, the memory array can include a plurality of memory cells, some of which may be grouped into a data structure 209. For example, in some embodiments, the data structure 209 can consist of a plurality of memory cells, however, distinction between the memory cells of the memory array 230 and the data structure 209 is made in FIG. 2A to assist the reader in discerning between the portion of memory cells that are reserved for use as a data structure 209 and the remaining memory cells of the memory array 230 that are free to perform functions generally performed by memory cells in operation of a memory array 230.

The data structure 209 can allow for bit strings (e.g., posit bit strings) to be organized and stored. In some embodiments, the data structure 209 can be a table (e.g., a look-up table), a tree, record, or other suitable data structure that allows for posit bit strings to be organized and stored within the memory array 230.

The data structure 209 can have a predetermined size (e.g., on receipt of a power signal (e.g., a power up or initiation signal that initializes the memory array), the memory array 230 can allocate a fixed number of memory cells for use as a data structure) or the data structure 209 can be dynamically allocated by, for example, the controller 210. In some embodiments, the data structure 209 can have a size of around eight (8) megabytes (MB), although embodiments are not limited to this specific size. For example, in the example described above if the posit bit strings each have a bit width of 8-bits (e.g., a posit bit string operand A, a posit bit string operand B, and a resultant posit bit string representing a result of an operation performed between the posit bit string operand A and the posit bit string operand B), the size of the data structure 209 can be around 8 MB. In embodiments in which more than three 8-bit posit bit strings are stored in the data structure 209 of the memory array 230, and/or in cases in which the posit bit strings are smaller than 8-bits (e.g., 6-bit posit strings, 4-bit posit strings, etc.) or larger than 8-bits (e.g., 16-bits, 32-bits, 64-bits, etc.), however, the data structure can have a size that is less than 8 MB or a size that is greater than 8 MB.

In a non-limiting example, the data structure 209 can be configured to store three posit bit strings. The three posit bit strings can correspond to a first posit bit string operand ("β"), a second posit bit string operand ("φ"), and a result of an arithmetic operation or a logical operation performed using the posit bit string operand, β, and the posit bit string operand φ. In this example, the control circuitry 220 can perform a requested operation (e.g., an arithmetic operation and/or a logical operation) between the posit bit string operand β and the posit bit string operand φ and cause the result of the operation (as well as the posit bit string operand β and the posit bit string operand φ) to be stored in the data structure 209 of the memory array 230. In this example, if performance of the operation is required at a subsequent point in time, the controller 210 can request, for example as part of performance of a recursive operation, the result of the operation between the posit bit string β and the posit bit string φ to be retrieved from the data structure 209 of the memory array 230.

Continuing with this non-limiting example, if the operation performed using the posit bit string β and the posit bit string φ is a recursive operation, the result of the operation (e.g., the arithmetic or logical operation) performed using the posit bit string β and the posit bit string φ that is stored in the memory array 230 can be transferred to the periphery sense amplifiers 211 and stored. Thereafter, a result of a subsequent operation that is performed as part of the recursive operation can be transferred to the periphery sense amplifiers 211 and stored such that iterations of the recursive operation are accumulated in the periphery sense amplifiers 211. As described herein, once the final result of the recursive operation is accumulated in the periphery sense amplifiers 211, an operation to round the final result of the recursive operation can be performed to truncate the result of the recursive operation to a particular bit width.

In another non-limiting example in which the memory array 230 is coupled to a plurality of sense amplifiers (e.g., the periphery sense amplifiers 211) and control circuitry 220, the control circuitry 220 can be configured to determine respective address locations in a data structure 209 within the memory array 230 in which a first bit string and a second bit string are stored. The first posit bit string and the second posit bit string can each represent a result of an arithmetic operation, a logical operation, or both. The control circuitry 220 can be configured to execute a command to retrieve at least one of the first posit bit string and the second posit bit string from the memory array 230 and/or cause the at least one of the first posit bit string and the second posit bit string to be stored in the plurality of sense amplifiers 211. Embodiments are not limited to storing the first posit bit string and/or the second posit bit string in the plurality of sense amplifiers, however, and in some embodiments, the control circuitry 220 can be configured to cause the at least one of the first posit bit string and the second posit bit string to be stored in periphery sense amplifiers that include one or more XRA component(s).

As described above, the control circuitry 220 configured to cause performance of an arithmetic operation, a logical operation, or both prior to the first bit string and a second bit string being stored in the data structure. For example, the control circuitry 220 can be configured to cause performance of an arithmetic operation and/or a logical operation using one or more posit bit string operands and cause the result of the operation to be stored in the data structure 209 of the memory array 230 for later use.

By performing the arithmetic and/or logical operation using the control circuitry 220 and then storing the result of the operation in the data structure 209 of the memory array 230, the result (and/or the posit bit string operands A and B) can be provided for use by the memory device 204 and/or the host 202 faster in comparison to approaches in which arithmetic and/or logical operations are performed in "real time" (e.g., in which the arithmetic and/or logical operations are performed each time performance of an arithmetic and/or logical operation is required.

As described herein, the arithmetic and/or logical operation can be performed as part of a recursive operation. For example, the at least one of the first posit bit string and the second posit bit string can be stored in the plurality of sense amplifiers 211 as part of performance of a recursive operation in which the at least one of the first posit bit string and the second posit bit string are used as operands. By storing the at least one of the first posit bit string and the second posit bit string in the plurality of sense amplifiers 211 during performance of the recursive operation, the accuracy of intermediate iterations of the recursive can be preserved until the recursive operation is completed.

Once it is determined that the recursive operation is completed, the control circuitry 220 can be configured to cause the result of the recursive operation to be rounded off. For example, the control circuitry 220 can be configured to cause at least one bit from the mantissa bit sub-set or an exponent bit sub-set of the at least one of the first posit bit string and the second posit bit string stored in the plurality of sense amplifiers 211 to be removed to round or truncate the at least one of the first posit bit string and the second posit bit string stored in the plurality of sense amplifiers 211.

The control circuitry 220 can be configured to determine the respective address locations within the memory array 230 in which a first bit string and a second bit string are stored in response to receipt of an initiation command received from a host 202 coupled to the memory device 204. In some embodiments the control circuitry 220 can be further configured to execute the command to retrieve the at least one of the first posit bit string and the second posit bit string from the memory array 220 without receiving a command in addition to the initiation command. For example, the control circuitry 220 can be configured to cause the at least one of the first posit bit string and the second posit bit string to be stored in the plurality of sense amplifiers 211 without receiving a command in addition to the initiation command.

In some embodiments, the control circuitry 220 can be configured to cause the at least one of the first posit bit string and the second posit bit string to be stored in the plurality of sense amplifiers 211 by sending a signal to enable the main memory input/output (I/O) circuitry 214 to, for example, cause the at least one of the first posit bit string and the second posit bit string is transferred to circuitry external to the array 220 via the main memory I/O circuitry 214.

Figure 2B:
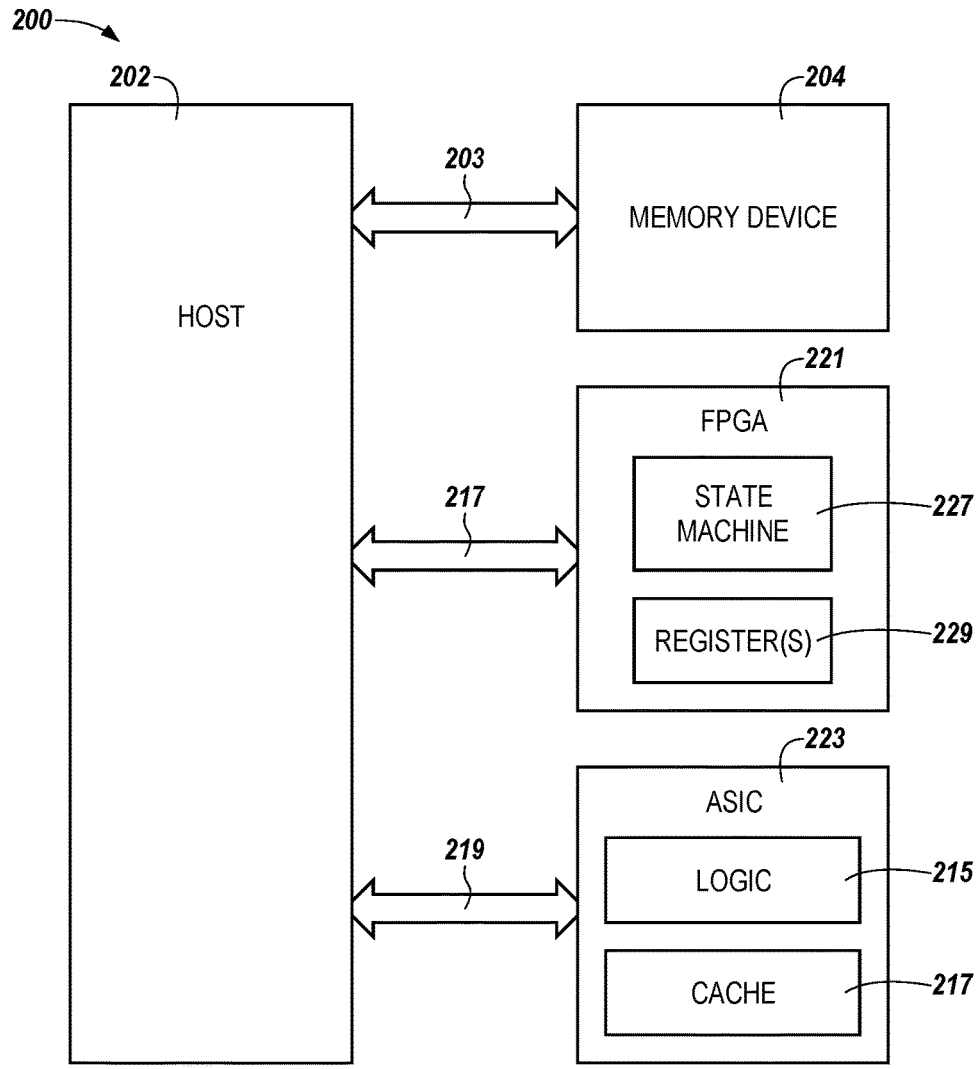
FIG. 2B is another functional block diagram in the form of a computing system including a host, a memory device, an application-specific integrated circuit, and a field programmable gate array in accordance with a number of embodiments of the present disclosure.

FIG. 2B is a functional block diagram in the form of a computing system 200 including a host 202, a memory device 204, an application-specific integrated circuit 223, and a field programmable gate array 221 in accordance with a number of embodiments of the present disclosure. Each of the components (e.g., the host 202, the memory device 204, the FPGA 221, the ASIC 223, etc.) can be separately referred to herein as an "apparatus."

As shown in FIG. 2B, the host 202 can be coupled to the memory device 204 via channel(s) 203, which can be analogous to the channel(s) 203 illustrated in FIG. 2A. The field programmable gate array (FPGA) 221 can be coupled to the host 202 via channel(s) 217 and the application-specific integrated circuit (ASIC) 223 can be coupled to the host 202 via channel(s) 219. In some embodiments, the channel(s) 217 and/or the channel(s) 219 can include a peripheral serial interconnect express (PCIe) interface, however, embodiments are not so limited, and the channel(s) 217 and/or the channel(s) 219 can include other types of interfaces, buses, communication channels, etc. to facilitate transfer of data between the host 202 and the FPGA 221 and/or the ASIC 223.

As described above, circuitry located on the memory device 204 (e.g., the control circuitry 220 illustrated in FIG. 2A) can perform recursive operations using posit bit strings and can cause intermediate results of the recursive operations to be stored in a peripheral location (e.g., the periphery sense amplifiers 211 illustrated in FIG. 2A) of the memory device 204. Embodiments are not so limited, however, and in some embodiments, the recursive operation(s) can be performed by the FPGA 221 and/or the ASIC 223. In embodiments in which the FPGA 221 and/or the ASIC 223 are configured to perform the recursive operations, the FPGA and/or the ASIC 223 can be configured to cause intermediate results of the recursive operations to be stored in the memory device 204, for example in the periphery sense amplifiers 211 illustrated in FIG. 2A.

As described above, non-limiting examples of recursive arithmetic and/or recursive logical operations that can be performed by the FPGA 221 and/or the ASIC 223 include arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or logical operations such as AND, OR, XOR, NOT, etc., as well as trigonometric operations such as sine, cosine, tangent, etc. using the posit bit strings.

The FPGA 221 can include a state machine 227 and/or register(s) 229. The state machine 227 can include one or more processing devices that are configured to perform operations on an input and produce an output. For example, the FPGA 221 can be configured to receive posit bit strings from the host 202 or the memory device 204 and perform one or more recursive operations using the posit bit strings as operands. After each iteration of the recursive operation is complete, the FPGA 221 can cause a bit string that represent the result of the iteration to be stored in the memory device 204 for example in the periphery sense amplifiers 211 illustrated in FIG. 2A.

The register(s) 229 of the FPGA 221 can be configured to buffer and/or store the posit bit strings received form the host 202 prior to the state machine 227 performing a recursive operation using the received posit bit strings. In addition, the register(s) 229 of the FPGA 221 can be configured to buffer and/or store intermediate results of iterations of the recursive operation prior to transferring the result to circuitry external to the ASIC 233, such as the host 202 or the memory device 204, etc.

The ASIC 223 can include logic 215 and/or a cache 217. The logic 215 can include circuitry configured to perform operations on an input and produce an output. In some embodiments, the ASIC 223 is configured to receive posit bit strings from the host 202 and/or the memory device 204 and perform one or more recursive operations using posit bit string operands.

The cache 217 of the ASIC 223 can be configured to buffer and/or store the posit bit strings received form the host 202 prior to the logic 215 performing an operation on the received posit bit strings. In addition, the cache 217 of the ASIC 223 can be configured to buffer and/or store intermediate results of iterations of the recursive operation prior to transferring the result to circuitry external to the ASIC 233, such as the host 202 or the memory device 204, etc.

Although the FPGA 227 is shown as including a state machine 227 and register(s) 229, in some embodiments, the FPGA 221 can include logic, such as the logic 215, and/or a cache, such as the cache 217 in addition to, or in lieu of, the state machine 227 and/or the register(s) 229. Similarly, the ASIC 223 can, in some embodiments, include a state machine, such as the state machine 227, and/or register(s), such as the register(s) 229 in addition to, or in lieu of, the logic 215 and/or the cache 217.

Figure 3:
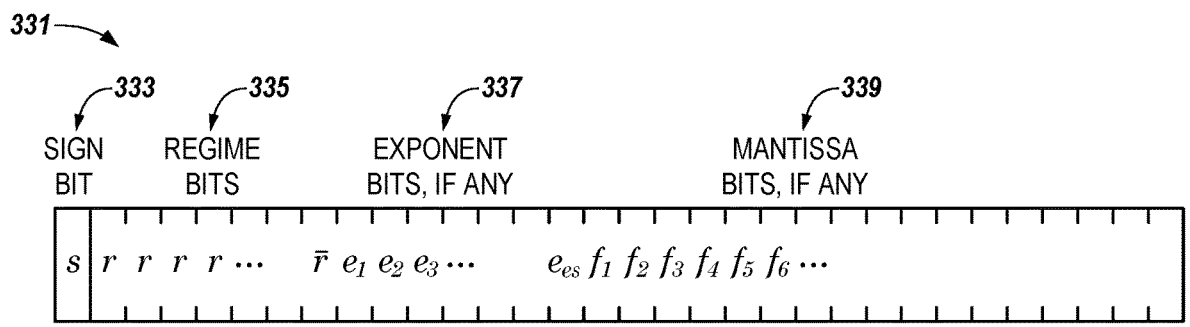
FIG. 3 is an example of an n-bit post with es exponent bits.

FIG. 3 is an example of an n-bit universal number, or "unum" with es exponent bits. In the example of FIG. 3, the n-bit unum is a posit bit string 331. As shown in FIG. 3, the n-bit posit 331 can include a set of sign bit(s) (e.g., a first bit sub-set or a sign bit sub-set 333), a set of regime bits (e.g., a second bit sub-set or the regime bit sub-set 335), a set of exponent bits (e.g., a third bit sub-set or an exponent bit sub-set 337), and a set of mantissa bits (e.g., a fourth bit sub-set or a mantissa bit sub-set 339). The mantissa bits 339 can be referred to in the alternative as a "fraction portion" or as "fraction bits," and can represent a portion of a bit string (e.g., a number) that follows a decimal point.

The sign bit 333 can be zero (0) for positive numbers and one (1) for negative numbers. The regime bits 335 are described in connection with Table 1, below, which shows (binary) bit strings and their related numerical meaning, k. In Table 1, the numerical meaning, k, is determined by the run length of the bit string. The letter x in the binary portion of Table 1 indicates that the bit value is irrelevant for determination of the regime, because the (binary) bit string is terminated in response to successive bit flips or when the end of the bit string is reached. For example, in the (binary) bit string 0010, the bit string terminates in response to a zero flipping to a one and then back to a zero. Accordingly, the last zero is irrelevant with respect to the regime and all that is considered for the regime are the leading identical bits and the first opposite bit that terminates the bit string (if the bit string includes such bits).

TABLE 1

| Binary | 0000 | 0001 | 001X | 01XX | 10XX | 110X | 1110 | 1111 |
|---|---|---|---|---|---|---|---|---|
| Numerical (k) | −4 | −3 | −2 | −1 | 0 | 1 | 2 | 3 |

In FIG. 3, the regime bits 335 r correspond to identical bits in the bit string, while the regime bits 335 $\bar{r}$ correspond to an opposite bit that terminates the bit string. For example, for the numerical k value −2 shown in Table 1, the regime bits r correspond to the first two leading zeros, while the regime bit(s) $\bar{r}$ correspond to the one. As noted above, the final bit corresponding to the numerical k, which is represented by the X in Table 1 is irrelevant to the regime.

If m corresponds to the number of identical bits in the bit string, if the bits are zero, k=−m. If the bits are one, then k=m−1. This is illustrated in Table 1 where, for example, the (binary) bit string 10XX has a single one and k=m−1=1−1=0. Similarly, the (binary) bit string 0001 includes three zeros so k=−m=−3. The regime can indicate a scale factor of useed$^k$, where useed=$2^{2^{es}}$. Several example values for used are shown below in Table 2.

TABLE 2

| es | 0 | 1 | 2 | 3 | 4 |
|---|---|---|---|---|---|
| used | 2 | $2^2 = 4$ | $4^2 = 16$ | $16^2 = 256$ | $256^2 = 65536$ |

The exponent bits 337 correspond to an exponent e, as an unsigned number. In contrast to floating-point numbers, the exponent bits 337 described herein may not have a bias associated therewith. As a result, the exponent bits 337 described herein may represent a scaling by a factor of $2^e$. As shown in FIG. 3, there can be up to es exponent bits ($e_1$, $e_2$, $e_3$, ..., $e_{es}$), depending on how many bits remain to right of the regime bits 335 of the n-bit posit 331. In some embodiments, this can allow for tapered accuracy of the n-bit posit 331 in which numbers which are nearer in magnitude to one have a higher accuracy than numbers which are very large or very small. However, as very large or very small numbers may be utilized less frequent in certain kinds of operations, the tapered accuracy behavior of the n-bit posit 331 shown in FIG. 3 may be desirable in a wide range of situations.

The mantissa bits 339 (or fraction bits) represent any additional bits that may be part of the n-bit posit 331 that lie to the right of the exponent bits 337. Similar to floating-point bit strings, the mantissa bits 339 represent a fraction f, which can be analogous to the fraction 1.f where f includes one or more bits to the right of the decimal point following the one. In contrast to floating-point bit strings, however, in the n-bit posit 331 shown in FIG. 3, the "hidden bit" (e.g., the one) may always be one (e.g., unity), whereas floating-point bit strings may include a subnormal number with a "hidden bit" of zero (e.g., 0.f).

As described herein, alter a numerical value or a quantity of bits of one of more of the sign 333 bit sub-set, the regime 335 bit sub-set, the exponent 337 bit sub-set, or the mantissa 339 bit sub-set can vary the precision of the n-bit posit 331. For example, changing the total number of bits in the n-bit posit 331 can alter the resolution of the n-bit posit bit string 331. That is, an 8-bit posit can be converted to a 16-bit posit by, for example, increasing the numerical values and/or the quantity of bits associated with one or more of the posit bit string's constituent bit sub-sets to increase the resolution of the posit bit string. Conversely, the resolution of a posit bit string can be decreased for example, from a 64-bit resolution to a 32-bit resolution by decreasing the numerical values and/or the quantity of bits associated with one or more of the posit bit string's constituent bit sub-sets.

In some embodiments, altering the numerical value and/or the quantity of bits associated with one or more of the regime 335 bit sub-set, the exponent 337 bit sub-set, and/or the mantissa 339 bit sub-set to vary the precision of the n-bit posit 331 can lead to an alteration to at least one of the other of the regime 335 bit sub-set, the exponent 337 bit sub-set, and/or the mantissa 339 bit sub-set. For example, when altering the precision of the n-bit posit 331 to increase the resolution of the n-bit posit bit string 331 (e.g., when performing an "up-convert" operation to increase the bit width of the n-bit posit bit string 331), the numerical value and/or the quantity of bits associated with one or more of the regime 335 bit sub-set, the exponent 337 bit sub-set, and/or the mantissa 339 bit sub-set may be altered.

In a non-limiting example in which the resolution of the n-bit posit bit string 331 is increased (e.g., the precision of the n-bit posit bit string 331 is varied to increase the bit width of the n-bit posit bit string 331) but the numerical value or the quantity of bits associated with the exponent 337 bit sub-set does not change, the numerical value or the quantity of bits associated with the mantissa 339 bit sub-set may be increased. In at least one embodiment, increasing the numerical value and/or the quantity of bits of the mantissa 339 bit sub-set when the exponent 338 bit sub-set remains unchanged can include adding one or more zero bits to the mantissa 339 bit sub-set.

In another non-limiting example in which the resolution of the n-bit posit bit string 331 is increased (e.g., the precision of the n-bit posit bit string 331 is varied to increase the bit width of the n-bit posit bit string 331) by altering the numerical value and/or the quantity of bits associated with the exponent 337 bit sub-set, the numerical value and/or the quantity of bits associated with the regime 335 bit sub-set and/or the mantissa 339 bit sub-set may be either increased or decreased. For example, if the numerical value and/or the quantity of bits associated with the exponent 337 bit sub-set is increased or decreased, corresponding alterations may be made to the numerical value and/or the quantity of bits associated with the regime 335 bit sub-set and/or the mantissa 339 bit sub-set. In at least one embodiment, increasing or decreasing the numerical value and/or the quantity of bits associated with the regime 335 bit sub-set and/or the mantissa 339 bit sub-set can include adding one or more zero bits to the regime 335 bit sub-set and/or the mantissa 339 bit sub-set and/or truncating the numerical value or the quantity of bits associated with the regime 335 bit sub-set and/or the mantissa 339 bit sub-set.

In another example in which the resolution of the n-bit posit bit string 331 is increased (e.g., the precision of the n-bit posit bit string 331 is varied to increase the bit width of the n-bit posit bit string 331), the numerical value and/or the quantity of bits associated with the exponent 335 bit sub-set may be increased and the numerical value and/or the quantity of bits associated with the regime 333 bit sub-set may be decreased. Conversely, in some embodiments, the numerical value and/or the quantity of bits associated with the exponent 335 bit sub-set may be decreased and the numerical value and/or the quantity of bits associated with the regime 333 bit sub-set may be increased.

In a non-limiting example in which the resolution of the n-bit posit bit string 331 is decreased (e.g., the precision of the n-bit posit bit string 331 is varied to decrease the bit width of the n-bit posit bit string 331) but the numerical value or the quantity of bits associated with the exponent 337 bit sub-set does not change, the numerical value or the quantity of bits associated with the mantissa 339 bit sub-set may be decreased. In at least one embodiment, decreasing the numerical value and/or the quantity of bits of the mantissa 339 bit sub-set when the exponent 338 bit sub-set remains unchanged can include truncating the numerical value and/or the quantity of bits associated with the mantissa 339 bit sub-set.

In another non-limiting example in which the resolution of the n-bit posit bit string 331 is decreased (e.g., the precision of the n-bit posit bit string 331 is varied to decrease the bit width of the n-bit posit bit string 331) by altering the numerical value and/or the quantity of bits associated with the exponent 337 bit sub-set, the numerical value and/or the quantity of bits associated with the regime 335 bit sub-set and/or the mantissa 339 bit sub-set may be either increased or decreased. For example, if the numerical value and/or the quantity of bits associated with the exponent 337 bit sub-set is increased or decreased, corresponding alterations may be made to the numerical value and/or the quantity of bits associated with the regime 335 bit sub-set and/or the mantissa 339 bit sub-set. In at least one embodiment, increasing or decreasing the numerical value and/or the quantity of bits associated with the regime 335 bit sub-set and/or the mantissa 339 bit sub-set can include adding one or more zero bits to the regime 335 bit sub-set and/or the mantissa 339 bit sub-set and/or truncating the numerical value or the quantity of bits associated with the regime 335 bit sub-set and/or the mantissa 339 bit sub-set.

In some embodiments, changing the numerical value and/or a quantity of bits in the exponent bit sub-set can alter the dynamic range of the n-bit posit 331. For example, a 32-bit posit bit string with an exponent bit sub-set having a numerical value of zero (e.g., a 32-bit posit bit string with es=0, or a (32,0) posit bit string) can have a dynamic range of approximately 18 decades. However, a 32-bit posit bit string with an exponent bit sub-set having a numerical value of 3 (e.g., a 32-bit posit bit string with es=3, or a (32,3) posit bit string) can have a dynamic range of approximately 145 decades.

Figure 4A:
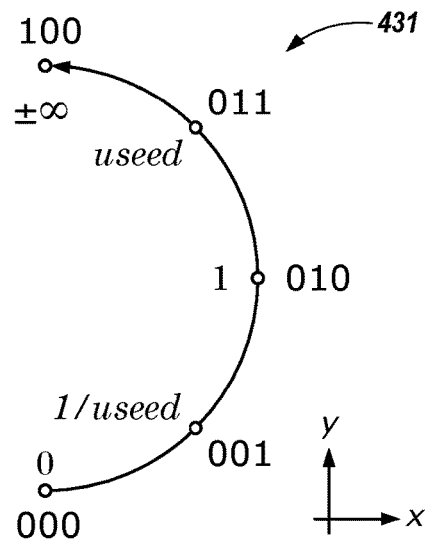
FIG. 4A is an example of positive values for a 3-bit posit.

FIG. 4A is an example of positive values for a 3-bit posit. In FIG. 4A, only the right half of projective real numbers, however, it will be appreciated that negative projective real numbers that correspond to their positive counterparts shown in FIG. 4A can exist on a curve representing a transformation about they-axis of the curves shown in FIG. 4A.

In the example of FIG. 4A, es=2, so useed=$2^{2^{es}}$=16. The precision of a posit 431-1 can be increased by appending bits the bit string, as shown in FIG. 4B. For example, appending a bit with a value of one (1) to bit strings of the posit 431-1 increases the accuracy of the posit 431-1 as shown by the posit 431-2 in FIG. 4B. Similarly, appending a bit with a value of one to bit strings of the posit 431-2 in FIG. 4B increases the accuracy of the posit 431-2 as shown by the posit 431-3 shown in FIG. 4B. An example of interpolation rules that may be used to append bits to the bits strings of the posits 431-1 shown in FIG. 4A to obtain the posits 431-2, 431-3 illustrated in FIG. 4B follow.

If maxpos is the largest positive value of a bit string of the posits 431-1, 431-2, 431-3 and minpos is the smallest value of a bit string of the posits 431-1, 431-2, 431-3, maxpos may be equivalent to useed and minpos may be equivalent to 1/useed. Between maxpos and ±∞, a new bit value may be maxpos*useed, and between zero and minpos, a new bit value may be minpos/useed. These new bit values can correspond to a new regime bit 335. Between existing values $x=2^m$ and $y=2^n$, where m and n differ by more than one, the new bit value may be given by the geometric mean:

$$\sqrt{x \times y} = 2^{\frac{(m+n)}{2}},$$

which corresponds to a new exponent bit 337. If the new bit value is midway between the existing x and y values next to it, the new bit value can represent the arithmetic mean x+y/2, which corresponds to a new mantissa bit 339.

Figure 4B:
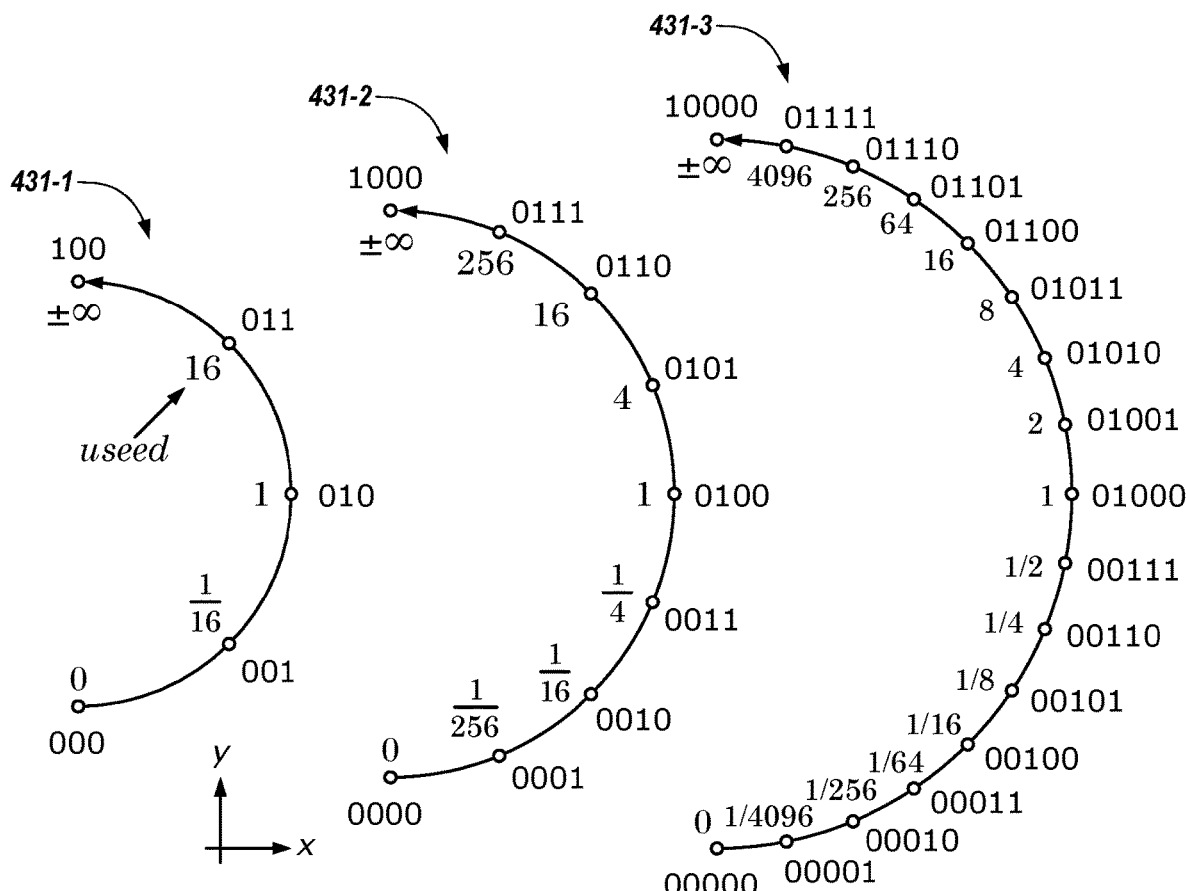
FIG. 4B is an example of posit construction using two exponent bits.

FIG. 4B is an example of posit construction using two exponent bits. In FIG. 4B, only the right half of projective real numbers, however, it will be appreciated that negative projective real numbers that correspond to their positive counterparts shown in FIG. 4B can exist on a curve representing a transformation about the y-axis of the curves shown in FIG. 4B. The posits 431-1, 431-2, 431-3 shown in FIG. 4B each include only two exception values: Zero (0) when all the bits of the bit string are zero and ±∞ when the bit string is a one (1) followed by all zeros. It is noted that the numerical values of the posits 431-1, 431-2, 431-3 shown in FIG. 4 are exactly $useed^k$. That is, the numerical values of the posits 431-1, 431-2, 431-3 shown in FIG. 4 are exactly useed to the power of the k value represented by the regime (e.g., the regime bits 335 described above in connection with FIG. 3). In FIG. 4B, the posit 431-1 has es=2, so $useed=2^{2es}=16$, the posit 431-2 has es=3, so $useed=2^{2es}=256$, and the posit 431-3 has es=4, so $useed=2^{2es}=4096$.

As an illustrative example of adding bits to the 3-bit posit 431-1 to create the 4-bit posit 431-2 of FIG. 4B, the useed=256, so the bit string corresponding to the useed of 256 has an additional regime bit appended thereto and the former useed, 16, has a terminating regime bit (r̄) appended thereto. As described above, between existing values, the corresponding bit strings have an additional exponent bit appended thereto. For example, the numerical values 1/16, 1/4, 1, and 4 will have an exponent bit appended thereto. That is, the final one corresponding to the numerical value 4 is an exponent bit, the final zero corresponding o the numerical value 1 is an exponent bit, etc. This pattern can be further seen in the posit 431-3, which is a 5-bit posit generated according to the rules above from the 4-bit posit 431-2. If another bit was added to the posit 431-3 in FIG. 4B to generate a 6-bit posit, mantissa bits 339 would be appended to the numerical values between 1/16 and 16.

A non-limiting example of decoding a posit (e.g., a posit 431) to obtain its numerical equivalent follows. In some embodiments, the bit string corresponding to a posit p is an unsigned integer ranging from $-2^{n-1}$ to $2^{n-1}$, k is an integer corresponding to the regime bits 335 and e is an unsigned integer corresponding to the exponent bits 337. If the set of mantissa bits 339 is represented as $\{f_1 f_2 \ldots f_{fs}\}$ and $f$ is a value represented by 1. $f_1 f_2 \ldots f_{fs}$ (e.g., by a one followed by a decimal point followed by the mantissa bits 339), the p can be given by Equation 2, below.

$$x = \begin{cases} 0, & p = 0 \\ \pm\infty, & p = -2^{n-1} \\ sign(p) \times useed^k \times 2^e \times f, & \text{all other } p \end{cases} \quad \text{Equation 2}$$

A further illustrative example of decoding a posit bit string is provided below in connection with the posit bit string 0000110111011101 shown in Table 3, below follows.

TABLE 3

| SIGN | REGIME | EXPONENT | MANTISSA |
|------|--------|----------|----------|
| 0    | 0001   | 101      | 11011101 |

In Table 3, the posit bit string 0000110111011101 is broken up into its constituent sets of bits (e.g., the sign bit 333, the regime bits 335, the exponent bits 337, and the mantissa bits 339). Since es=3 in the posit bit string shown in Table 3 (e.g., because there are three exponent bits), useed=256. Because the sign bit 333 is zero, the value of the numerical expression corresponding to the posit bit string shown in Table 3 is positive. The regime bits 335 have a run of three consecutive zeros corresponding to a value of −3 (as described above in connection with Table 1). As a result, the scale factor contributed by the regime bits 335 is $256^{-3}$ (e.g., $useed^k$). The exponent bits 337 represent five (5) as an unsigned integer and therefore contribute an additional scale factor of $2^e=2^5=32$. Lastly, the mantissa bits 339, which are given in Table 3 as 11011101, represent two-hundred and twenty-one (221) as an unsigned integer, so the mantissa bits 339, given above as f are $$f + \frac{221}{256}.$$

Using these values and equation 2, the numerical value corresponding to the posit bit string given in Table 3 is $$+256^{-3} \times 2^5 \times \left(1 + \frac{221}{256}\right) = \frac{437}{134217728} \approx 3.55393 \times 10^{-6}.$$

Figure 5:
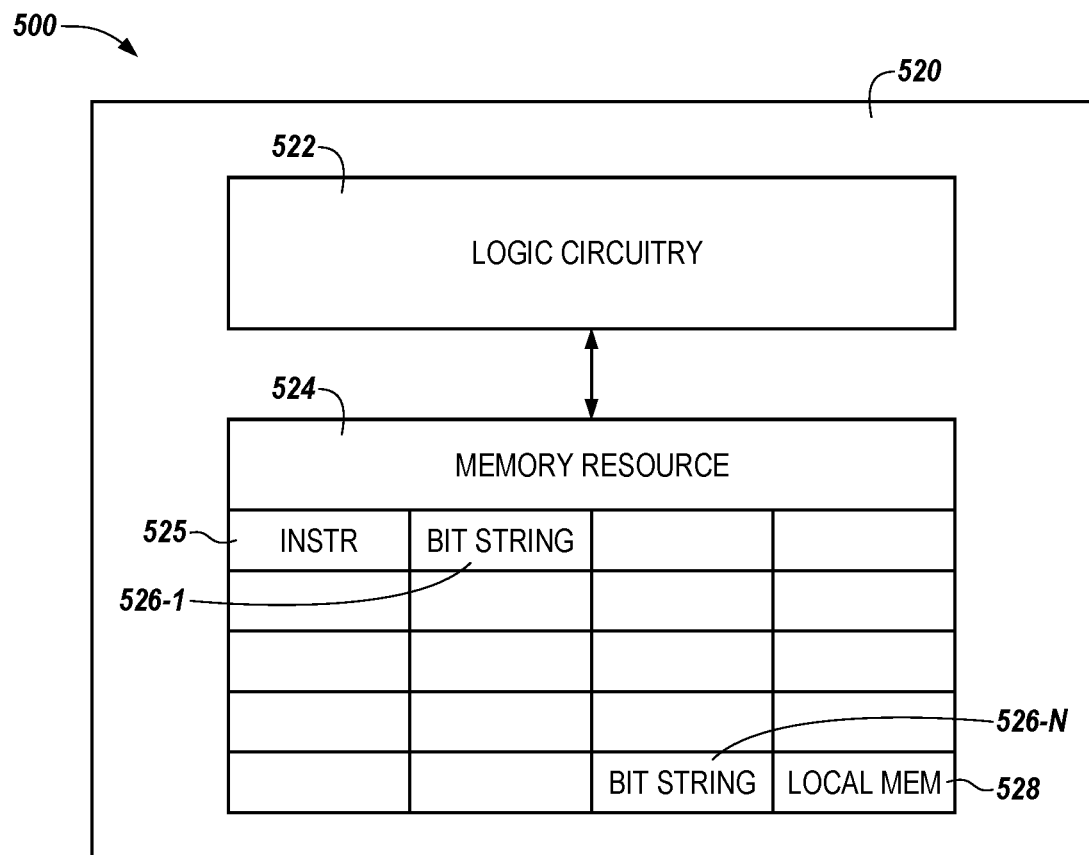
FIG. 5 is a functional block diagram in the form of control circuitry in accordance with a number of embodiments of the present disclosure.

FIG. 5 is a functional block diagram in the form of an apparatus 500 including control circuitry 520 in accordance with a number of embodiments of the present disclosure. The control circuitry 520 can include logic circuitry 522 and a memory resource 524, which can be analogous to the logic circuitry 122 and the memory resource 124 illustrated in FIG. 1, herein. The logic circuitry 522 and/or the memory resource 524 can separately be considered an "apparatus."

The control circuitry 520 can be configured to receive a command (e.g., an initiation command) from a host (e.g., the host 102/202 illustrated in FIGS. 1 and 2, herein) and/or a controller (e.g., the controller 210 illustrated in FIG. 2, herein) to initiate performance of one or more operations (e.g., recursive operations, etc.) on data stored in the memory resource 524. Once the initiation command has been received by the control circuitry 520, the control circuitry 520 can perform the operations described above in the absence of intervening commands from the host and/or the controller. For example, the control circuitry 520 can include sufficient processing resources and/or instructions to perform operations on the bit strings stored in the memory resource 524 without receiving additional commands from circuitry external to the control circuitry 520.

The logic circuitry 522 can be an arithmetic logic unit (ALU), a state machine, sequencer, controller, an instruction set architecture, or other type of control circuitry. As described above, an ALU can include circuitry to perform operations (e.g., recursive operations using bit strings, etc.) such as the operations described above, using integer binary numbers, such as bit strings in the posit format. An instruction set architecture (ISA) can include a reduced instruction set computing (RISC) device. In embodiments in which the logic circuitry 522 includes a RISC device, the RISC device can include a processing resource or processing unit that can employ an instruction set architecture (ISA) such as a RISC-V ISA, however, embodiments are not limited to RISC-V ISAs and other processing devices and/or ISAs can be used.

In some embodiments, the logic circuitry 522 can be configured to execute instructions (e.g., instructions stored in the INSTR 525 portion of the memory resource 524) to perform the operations herein. For example, the logic circuitry 524 is provisioned with sufficient processing resources to cause performance of such operations on the data (e.g., on bit strings) received by the control circuitry 520.

Once the operation(s) are performed by the logic circuitry 522, the resultant bit strings can be stored in the memory resource 524 and/or a memory array (e.g., the memory array 230 illustrated in FIG. 2, herein). The stored resultant bit strings can be addressed such that it is accessible for performance of the operations. For example, the bit strings can be stored in the memory resource 524 and/or the memory array at particular physical addresses (which may have corresponding logical addresses corresponding thereto) such that the bit strings can be accessed in performing the operations. In some embodiments, the bit strings can be transferred to periphery sense amplifiers (e.g., the sense amps 111 and/or the periphery sense amplifiers 211 illustrated in FIGS. 1 and 2, respectively).

The memory resource 524 can, in some embodiments, be a memory resource such as random-access memory (e.g., RAM, SRAM, etc.). Embodiments are not so limited, however, and the memory resource 524 can include various registers, caches, buffers, and/or memory arrays (e.g., 1T1C, 2T2C, 3T, etc. DRAM arrays). The memory resource 524 can be configured to receive a bit string(s) from, for example, a host such as the host 202 illustrated in FIGS. 2A-2C and/or a memory array such as the memory array 230 illustrated in FIGS. 2A and 2B, herein. In some embodiments, the memory resource 538 can have a size of approximately 256 kilobytes (KB), however, embodiments are not limited to this particular size, and the memory resource 524 can have a size greater than, or less than, 256 KB.

The memory resource 524 can be partitioned into one or more addressable memory regions. As shown in FIG. 5, the memory resource 524 can be partitioned into addressable memory regions so that various types of data can be stored therein. For example, one or more memory regions can store instructions ("INSTR") 525 used by the memory resource 524, one or more memory regions can store bit strings 526-1, . . . , 526-N (e.g., data such as a bit string retrieved from the host and/or the memory array), and/or one or more memory regions can serve as a local memory ("LOCAL MEM.") 528 portion of the memory resource 538. Although 20 distinct memory regions are shown in FIG. 5, it will be appreciated that the memory resource 524 can be partitioned into any number of distinct memory regions.

As discussed above, the bit string(s) can be retrieved from the host and/or memory array in response to messages and/or commands generated by the host, a controller (e.g., the controller 210 illustrated in FIG. 2, herein), or the logic circuitry 522. In some embodiments, the commands and/or messages can be processed by the logic circuitry 522. Once the bit string(s) are received by the control circuitry 520 and stored in the memory resource 524, they can be processed by the logic circuitry 522. Processing the bit string(s) by the logic circuitry 522 can include performing recursive operations such as multiply-accumulate operations, using the bit strings as operands.

In a non-limiting neural network training application, the control circuitry 520 can convert a 16-bit posit with es=0 into an 8-bit posit with es=0 for use in a neural network training application. In some approaches, a half-precision 16-bit floating-point bit string can be used for neural network training, however, in contrast to some approaches that utilize a half-precision 16-bit floating-point bit string for neural network training, an 8-bit posit bit string with es=0 can provide comparable neural network training results two to four times faster than the half-precision 16-bit floating-point bit string.

For example, if the control circuitry 520 receives a 16-bit posit bit string with es=0 for use in a neural network training application, the control circuitry 520 can selectively remove bits from one or more bit sub-sets of the 16-bit posit bit string to vary the precision of the 16-bit posit bit string to an 8-bit posit bit string with es=0. It will be appreciated that embodiments are not so limited, and the control circuitry 520 can vary the precision of the bit string to produce an 8-bit posit bit string with es=1 (or some other value). In addition, the control circuitry 520 can vary the precision of the 16-bit posit bit string to yield a 32-bit posit bit string (or some other value).

During performance of the operations connected with the above example, the control circuitry 520 can be configured to cause results of the operation at each iteration to be stored in circuitry in the periphery of a memory device or memory array. For example, the control circuitry 520 can be configured to cause results of the operation at each iteration to be stored in a plurality of peripheral sense amplifiers such as the peripheral sense amplifiers 211 illustrated in FIG. 2A. These intermediate results can be used in subsequent iterations of a recursive operation in the context of a neural network training application to improve the accuracy of the final result of the operation, as described herein.

A common function used in training neural networks is a sigmoid function $f(x)$ (e.g., a function that asymptotically approaches zero as $x \rightarrow -\infty$ and asymptotically approaches 1 as $x \rightarrow \infty$). An example of a sigmoid function that may be used in neural network training applications is $$\frac{1}{1+e^{-x}},$$

which can require upwards of one-hundred clock cycles to compute using half-precision 16-bit floating-point bit strings. However, using an 8-bit posit with es=0, the same function can be evaluated by flipping the first bit of the posit representing x and shifting two bits to the right—operations that may take at least an order of magnitude fewer clock signals in comparison to evaluation of the same function using a half-precision 16-bit floating-point bit string.

Further, by allowing for results of iterations of the evaluation of the sigmoid function to be preserved without rounding or truncating the results of the iterations, the accuracy of the final result can be improved in comparison to approaches in which intermediate results of the operation are rounded or truncated. For example, by storing intermediate results of a recursive operation to evaluate a sigmoid function in, for example, periphery sense amplifiers such as the periphery sense amplifiers 211 illustrated in FIG. 2A, the accuracy of the final result can be improved in comparison to approaches in which intermediate results of the operation are rounded or truncated.

In this example, by operating the control circuitry 520 to vary the precision of the posit bit string to yield a more desirable level of precision, processing time, resource consumption, and/or storage space can be reduced in comparison to approaches that do not include control circuitry 520 configured to perform such conversion and/or subsequent operations. This reduction in processing time, resource consumption, and/or storage space can improve the function of a computing device in which the control circuitry 520 is operating by reducing the number of clock signals used in performing such operations, which may reduce an amount of power consumed by the computing device and/or an amount of time to perform such operations, as well as by freeing up processing and/or memory resources for other tasks and functions.

Figure 6:
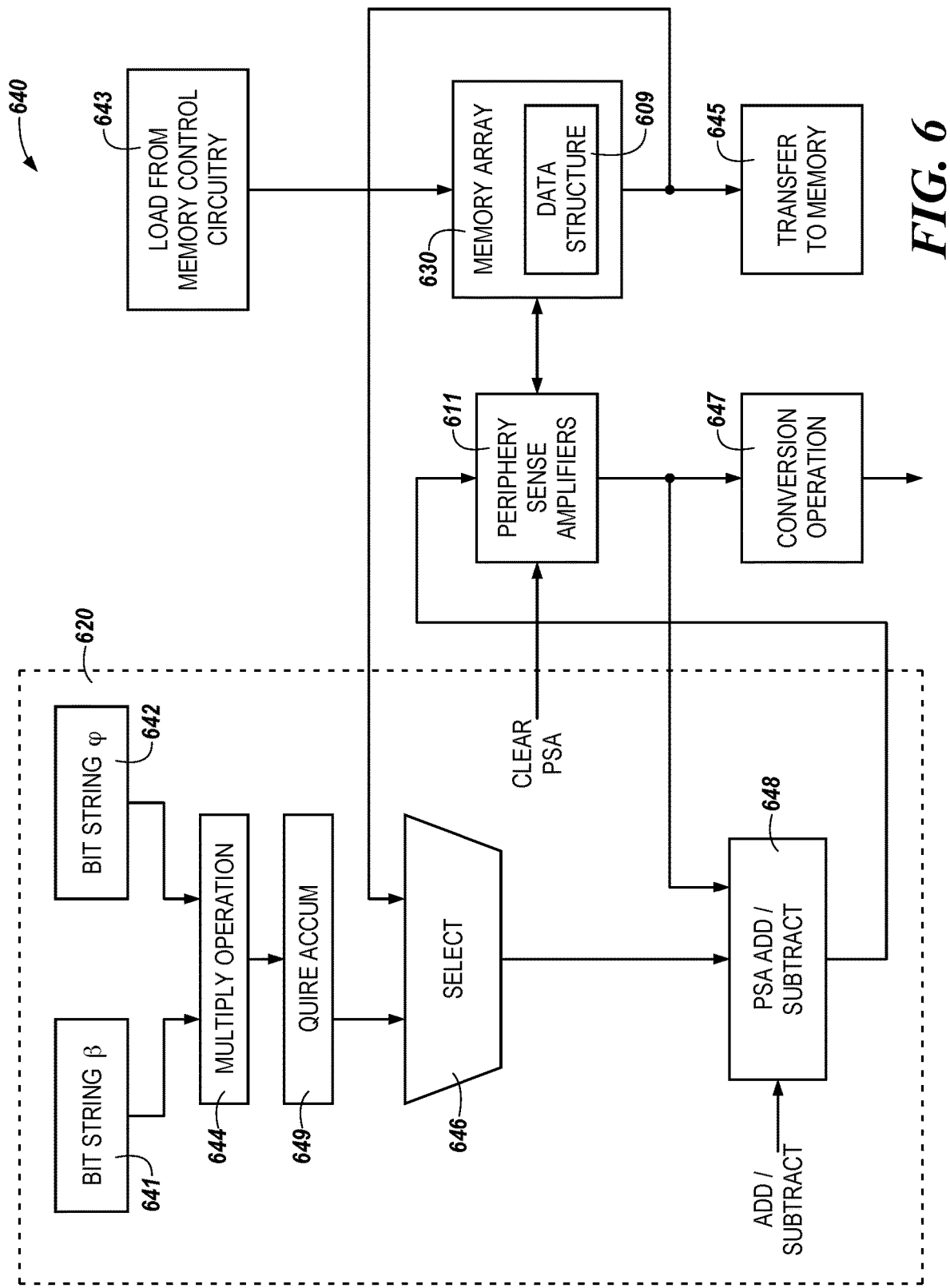
FIG. 6 is a block diagram representing an example of bit string accumulation in memory array periphery in accordance with a number of embodiments of the present disclosure.

FIG. 6 is a block diagram 640 representing an example of bit string accumulation in memory array periphery in accordance with a number of embodiments of the present disclosure. Several functions available to, or performed by, the periphery sense amplifiers (e.g., the periphery sense amplifiers 211 illustrated in FIG. 2A) are described in connection with FIG. 6 to further illustrate aspects of the present disclosure. For example, a multiply-accumulate operation using control circuitry 620 is described in connection with FIG. 6. As shown in FIG. 6, operations to provide bit string accumulation in a memory array periphery can be performed using control circuitry 620, which can be analogous to the control circuitry 120/220 illustrated in FIGS. 1 and 2A, herein.

As shown in FIG. 6, at block 641, a first bit string β can be received by the control circuitry 620. Further, as shown at block 642, a second bit string φ can be received by the control circuitry 620. For example, the first bit string β and the second bit string φ can be loaded into a memory resource (e.g., the memory resource 124 illustrated in FIG. 1) of the control circuitry 620. In some embodiments, the first bit string β and/or the second bit string φ can be formatted according to a unum or posit format.

At block 644, a multiplication operation can be performed using the first bit string β and the second bit string φ as operands. Subsequent to performance of the multiplication operation at block 644, the control circuitry 620 can be configured to convert the result of the multiplication operation to a format that can be stored in the periphery sense amplifiers 611 and/or the memory array 630. In some embodiments, as a result of performance of the multiplication operation, bits in various bit sub-sets of the resulting bit string may shift. For example, bits in the mantissa bit sub-set and/or the regime bit sub-set of the resulting bit string may shift. In order to address this potential issue, the control circuitry 620 can convert the result of the multiplication operation into a format that can be stored in the periphery sense amplifiers 611 and/or the memory array 630 without introducing errors that can arise from the bits that may have shifted.

At block 649, the result of the multiplication operation can be accumulated, for example, in a quire accumulator. In some embodiments, the result stored in the quire accumulator can be multiplexed with a bit string stored in the memory array 630, as shown at block 646. Embodiments are not so limited, however and in some embodiments, the result of the multiplication stored in the quire accumulator at block 649 can be multiplexed with an intermediate result of a recursive operation that can be stored in the periphery sense amplifiers 611.

In some embodiments, the control circuitry 620 can be configured to perform an operation at block 646 to select either the result of the multiplication operation or a previous resultant bit string stored in the memory array 630. Whether the result of the multiplication operation or the previous resultant bit string stored in the memory array 630 is selected at block 646 can depend on the application. For example, because the bit string stored in the memory array 630 may be a result of a previous operation, depending on the type of recursive operation being performed, it may be beneficial to use the bit string stored in the memory array 630 in performance of subsequent operations performed by the control circuitry 620.

Once the bit string has been selected (e.g., either the bit string that resulted from performance of the multiplication operation or the bit sting stored in the memory array 630), the selected result can be accumulated at block 648. For example, the result of the multiplication operation or the bit sting stored in the memory array 630 can be added to or subtracted from a bit string stored in the periphery sense amplifiers 611 as part of an operation to accumulate the bit strings resulting from the recursive operation.

As shown in FIG. 6, this result (e.g., a bit string resulting from performance of the operation to accumulate the selected bit string(s)) can be transferred to the periphery sense amplifiers 611. As described above, by storing such results (e.g., results of the recursive operation at each iteration) in the periphery sense amplifiers 611, the accuracy of the resultant bit strings can be preserved in comparison to approaches in which bit strings are truncated following one or more iterations of the recursive operation.

Once the accumulated result of the recursive operation is transferred to the periphery sense amplifier 611, it can be copied to the memory array 630. In some embodiments, the copied accumulated bit string that is transferred from the periphery sense amplifier 611 to the memory array 630 can be stored in the memory array 630 for subsequent use. The accumulated bit string that is stored in the memory array 630 can, in some embodiments, be stored in a data structure of the memory array 630, such as the data structure 209 illustrated in FIG. 2A, or the accumulated bit string that is stored in the memory array 630 can be stored in a different location within the memory array 630.

The accumulated bit string stored in the data structure 609 can, in some embodiments, represent a final result of a recursive operation performed using the control circuitry 620. For example, once the final result of the recursive operation is stored in the periphery sense amplifiers 611, the final result of the recursive operation can be copied to the data structure 609 of the memory array 630 and stored for subsequent use. In some embodiments, the final result of the operation stored in the data structure 609 can be multiplexed, for example at block 646, with a result from a subsequent multiplication operation performed at block 644.

At block 648, a result of the multiplication operation performed at 644 can be added to or subtracted from a current bit string stored in the periphery sense amplifiers 611. For example, during performance of a recursive operation, such as a multiply-accumulate operation, using the control circuitry 620, the result of each iteration of the recursive operation can, at block 648 be accumulated in the periphery sense amplifiers 611. In some embodiments, accumulating the result of each iteration of the recursive operation can include overwriting the previously stored result of a preceding iteration of the recursive operation in the periphery sense amplifiers 611, adding a result of the current iteration of the recursive operation to the result of the previous iteration of the recursive operation that is stored in the periphery sense amplifiers, or subtracting a result of the current iteration of the recursive operation to the result of the previous iteration of the recursive operation that is stored in the periphery sense amplifiers.

Once the recursive operation is complete, as shown at block 647, the final result of the recursive operation that is stored in the periphery sense amplifiers 611 can be transferred to the memory array 630 or the final result of the recursive operation that is stored in the periphery sense amplifiers 611 can be converted to a format different than a format in which the final result of the recursive operation is stored in the periphery sense amplifiers 611. For example, if the final result of the recursive operation is stored in a posit format, the final result can be converted to a floating-point format, or vice versa. Similarly, the final result of the recursive operation can be converted between other formats if, for example, the bit strings stored in the periphery sense amplifiers 611 are not stored in the posit format, the final result of the recursive operation can be converted to the posit format after it has been transferred out of the periphery sense amplifiers 611 at block 647.

In some embodiments, the final result of the recursive operation that is stored in the periphery sense amplifiers 611 can be rounded off such that the final resultant bit string has a particular bit width. The final result of the recursive operation can be rounded off by removing at least one bit from a mantissa bit sub-set or an exponent bit sub-set of the resultant bit string, or both. For example, once the recursive operation is complete, the control circuitry 620 can cause the final result of the operation to be rounded to a bit width that can be transferred to circuitry external to the periphery sense amplifiers 611. As described above, the bit width of the rounded final result can be predetermined, or it can be set in response to a command, such as a user command.

In some embodiments, the periphery sense amplifiers 611 can be "cleared" as indicated by the arrow pointing from CLEAR PSA to the periphery sense amplifiers 611. For example, in response to a command to delete the information stored in the periphery sense amplifiers 611, the data stored in the periphery sense amplifiers 611 can be cleared. This may be desirable upon conclusion of a recursive operation in which results of iterations of the recursive operation are accumulated in the periphery sense amplifiers 611 in preparation for performance of a subsequent recursive operation that may include accumulating results of iterations of the recursive operation in the periphery sense amplifiers 611.

At block 643, bit strings to be used in performance of an operation such as a recursive arithmetic and/or recursive logical operation can be transferred to a memory array 630, which can be analogous to the memory array 130/230 illustrated in FIGS. 1 and 2A, herein. In some embodiments, the bit strings can be transferred from control circuitry external to a memory device in which the memory array 630 is deployed. For example, bit strings can be transferred from a host (e.g., the host 102/202 illustrated in FIGS. 1, 2A, and 2B, herein) to the memory array 630. Once the bit strings are stored by the memory array 630, they can be transferred to the control circuitry 620 and the control circuitry 620 can perform or cause performance of recursive operations using the bit strings as operands.

Embodiments are not so limited, however, and as described above in connection with FIG. 2A, the memory array 630 can be configured to store bit strings that represent results of arithmetic and/or logical operations performed prior to the resultant bit string(s) being stored in the memory array 630. For example, the memory array 630 can store resultant bit strings in a data structure, such as the data structure 209 illustrated in FIG. 2A in order to increase a speed at which operations using the resultant bit strings are performed.

In some embodiments, the bit strings can be transferred between the memory array 630 and the periphery sense amplifiers 611, as indicated by the arrow connecting the periphery sense amplifier 611 block and the memory array 630 block. Further, in some embodiments, the bit strings stored by the memory array 630 can be transferred to an external memory, as shown as block 645. The external memory can be a memory that is external to the memory device in which the memory array 630 is deployed. For example, the memory can be an external storage volume such as a HDD, flash memory device, SSD, or other external memory.

In a non-limiting example, a posit bit string β (at block 641) and a posit bit string φ (at block 642) are multiplied together at block 644 using the control circuitry 620. The result of this multiplication operation, e.g., a posit bit string λ can be stored in the periphery sense amplifiers 611 and/or a copy of the resultant posit bit string λ can be stored in the memory array 630. In this example, the posit bit string λ can be selected for accumulation at block 646. In some embodiments, prior to storing the result of the multiplication operation, the result can be converted to a format that can be stored in the periphery sense amplifiers 611 and/or the memory array 630, as described above. For example, the result can be converted to a binary format, a floating-point format, or the shape of the bit string may be altered (e.g., from a (16,2) posit to a (16,3) posit, etc.).

At block 648, the posit bit string λ can then be added to, or subtracted from, a previous bit string stored in the periphery sense amplifiers 611 as part of performance of a recursive operation. The result of the addition or subtraction operation (e.g., the accumulation operation) performed at block 648 can be transferred to the periphery sense amplifiers 611 and stored. In some embodiments, the result of the addition or subtraction operation performed at block 648 can be stored in the periphery sense amplifiers 611 such that the previous bit string (e.g., the posit bit string λ) is overwritten.

These operations may be repeated until the recursive operation is completed, at which point the final result stored in the periphery sense amplifiers 611 can be rounded, as described above. In some embodiments, subsequent to rounding the final result stored in the periphery sense amplifiers 611, the final result can be converted to a unum or posit format (or other format, such as the floating-point format) and transferred to the memory array 630 or to external circuitry such as a host.

In another non-limiting example, a bit string stored in the memory array 630 can be selected at block 646 to be accumulated. As described above, the bit string stored in the memory array 630 can be a copy of a bit string stored in the periphery sense amplifiers 611, although embodiments are not so limited. In this example, the bit string stored in the memory array 630 can be accumulated with the bit string stored in the periphery sense amplifiers 611 at, for example, block 648. The resultant bit string of the accumulation at block 648 can be stored back in the periphery sense amplifiers 611 and/or the memory array 630. In some embodiments, the result of the accumulation operation performed at block 648 can be stored in the periphery sense amplifiers 611 such that the previous bit string (e.g., the posit bit string λ) is overwritten.

This operation may be repeated until the recursive operation is completed, at which point the final result stored in the periphery sense amplifiers 611 can be rounded, as described above. In some embodiments, subsequent to rounding the final result stored in the periphery sense amplifiers 611, the final result can be converted to a unum or posit format (or other format, such as the floating-point format) and transferred to the memory array 630 or to external circuitry such as a host.

Figure 7:
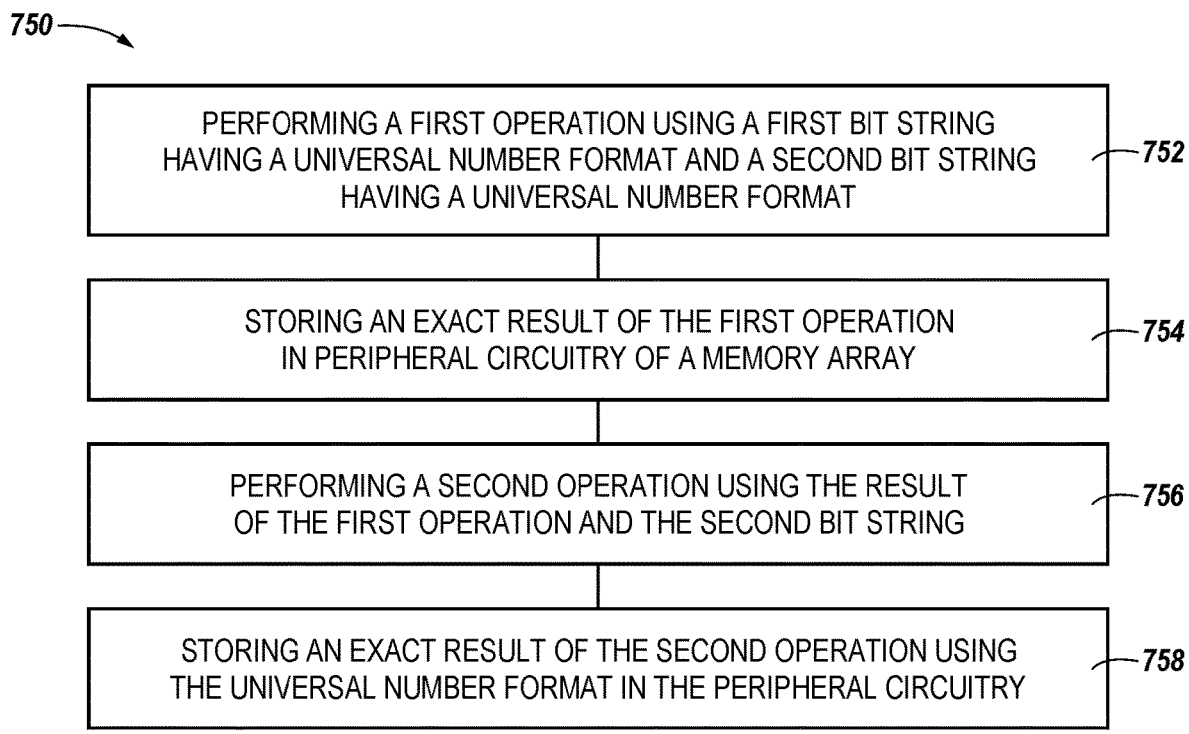
FIG. 7 is a flow diagram representing an example method for bit string accumulation in memory array periphery in accordance with a number of embodiments of the present disclosure.

FIG. 7 is a flow diagram representing an example method 750 for bit string accumulation in memory array periphery in accordance with a number of embodiments of the present disclosure. At block 752, the method 750 can include performing a first operation using a first bit string and a second bit string. The first operation can be an arithmetic operation, a logical operation, a bit-wise operation, or a vector operation, among others. In some embodiments, the first bit string and the second bit string can be formatted according to unum (e.g., a Type III unum or posit) format).

At block 754, the method 750 can include storing a result of the first operation in peripheral circuitry of a memory array. The peripheral circuitry can include peripheral sense amplifiers, such as the peripheral sense amplifiers 211 illustrated in FIG. 2A, and the memory array can be analogous to the memory array 130/230 illustrated in FIGS. 1, 2A, and 2B, herein. Embodiments are not limited to storing the result of the first operation in peripheral sense amplifiers, however, and in some embodiments, the method 750 can include storing the result of the first operation in an extended row address component that is coupled to, but distinct from, the memory array.

At block 756, the method 750 can include performing a second operation using the result of the first operation and the second bit string. The second operation can be an arithmetic operation, a logical operation, a bit-wise operation, or a vector operation, among others. In some embodiments, the first operation and the second operation can be performed as part of a recursive operation. As a result, in some embodiments, the result of the first operation or the second operation can have a greater bit width than the result of the other of the first operation and the second operation.

In embodiments in which the first operation and the second operation are performed as part of a recursive operation, the method 750 can further include determining that the result of the second operation is a final resultant bit string of the recursive operation and/or performing an operation to round the final resultant bit string stored in the extended row address component subsequent to the determination such that the final resultant bit string has a particular bit width. For example, the method 750 can include removing at least one bit from a mantissa bit sub-set or an exponent bit sub-set of the final resultant bit string to round the final resultant bit string stored in the extended row address component.

In some embodiments, the method 750 can include receiving a user command to remove the at least one bit by rounding, in response to the user command, the final resultant bit string to have a bit width defined by the user command. For example, the method 750 can include receiving a user command that defines a bit width requested for the final resultant bit string of the recursive operation and rounding the final resultant bit string to have the requested bit width. As described above, non-limiting examples of such bit widths can include 8-bits, 16-bits, 32-bits, 64-bits, etc., and may be based on an application for which the final resultant bit string is to be used.

In some embodiments, as mentioned above, the first bit string and the second bit string can be formatted according to a Type III universal number (unum) format or a posit format. In such embodiments, the method 750 can include converting the result of the first operation from the Type III unum format or the posit format to a different format prior to storing the result of the first operation in the extended row address component and/or converting the result of the second operation from the Type III unum format or the posit format to the different format prior to storing the result of the second operation in the extended row address component.

In some embodiments in which the first operation and the second operation are performed as part of a recursive operation, the method 750 can further include determining that the result of the second operation is a final resultant bit string of the recursive operation and performing an operation to convert the final resultant bit string to a Type III universal number format or a posit format. For example during performance of the first operation, the second operation, and/or the storing of the result of the first operation and/or the result of the second in the peripheral circuitry, the first bit string, the second bit string, and/or a bit string that represents a result of the first operation may be converted into a format that is different than a unum (e.g., a Type III unum or posit format). Accordingly, in some embodiments, the final resultant bit string may be converted (e.g., by control circuitry such as the control circuitry 120/220 illustrated in FIGS. 1 and 2A) from the format in which it is stored in the peripheral circuitry to a unum format.

At block 758, the method 750 can include storing a result of the second operation using the universal number format in the peripheral circuitry. For example, the method 750 can include storing the result of the second operation in a plurality of sense amplifiers that are coupled to, but distinct from, the memory array (e.g., the sense amps 111 and/or the periphery sense amplifiers 211 illustrated in FIGS. 1 and 2A, respectively) and/or an XRA component that is in the periphery of the memory array. The result of the second operation can, in some embodiments, be stored in the peripheral circuitry such that the result of the first operation performed at block 752 is overwritten.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    a plurality of sense amplifiers located in a periphery area of a memory array comprising a same quantity of rows or columns as a quantity of sense amplifiers of the plurality of sense amplifiers; and
    control circuitry comprising a memory array processing device coupled to the plurality of sense amplifiers and the memory array and a memory resource, wherein the processing device is configured to:
        cause one or more bit strings to be written from the memory array to the memory resource;
        cause performance of a first iteration of a recursive operation using the one or more bit strings written to the memory resource, wherein the one or more bit strings are formatted according to a Type III universal number format or a posit format;
        cause a first resultant bit string representing a result of the first iteration of the recursive operation to be accumulated in the plurality of sense amplifiers;
        determine whether to perform a second iteration of the recursive operation using the one or more bit strings written to the memory resource or one or more bit strings stored in the memory array;
        cause performance of a second iteration of the recursive operation using the one or more bit strings written to the memory resource or the one or more bit strings stored in the memory array; and
        cause a second resulting bit string representing a result of the second iteration of the recursive operation to be accumulated in the plurality of sense amplifiers.

2. The apparatus of claim 1, wherein the processing device is further configured to:
    determine that the recursive operation is complete; and
    cause performance of an operation to round the resultant bit string stored in the plurality of sense amplifiers subsequent to the determination such that the final resultant bit string has a particular bit width by removing at least one bit from a mantissa bit sub-set or an exponent bit sub-set of the resultant bit string, or both.

3. The apparatus of claim 1, wherein the plurality of sense amplifiers and the memory array comprise a memory device, and wherein the processing device is configured to perform the recursive operation within the memory array without transferring the resultant bit strings to circuitry external to the memory device.

4. The apparatus of claim 1, wherein the processing device is configured to:
    access an address space of the memory array in which a first resultant bit string that represents a result of a first iteration of the recursive operation is stored;
    access an address space of the memory array in which a second resultant bit string that represents a result of a second iteration of the recursive operation is stored; and
    store a bit string representing a result of an operation performed using the first resultant bit string and the second resultant bit string in the plurality of sense amplifiers.

5. The apparatus of claim 1, wherein the processing device is configured to cause the resultant bit strings to be accumulated in the plurality of sense amplifiers in response to receipt of a user generated command.

6. The apparatus of claim 1, wherein the processing device is further configured to cause resultant bit strings representing results of iterations of the recursive operation to be accumulated in the plurality of sense amplifiers by overwriting a previously stored resultant bit string in the plurality of sense amplifiers.

7. A method, comprising:
    retrieving, by control circuitry external to a memory array, a first bit string and a second bit string for use in performance of a recursive operation, wherein the first bit string and the second bit string are formatted in a universal number format;
    performing, by the control circuitry, a first operation using the first bit string and the second bit string;
    storing an exact result of the first operation in peripheral circuitry of the memory array;
    determining, by the control circuitry, whether to perform a second operation using the result of the first operation and the second bit string or the result of the first operation and a bit string stored in the memory array;
    performing the second operation using the result of the first operation and the second bit string or the result of the first operation and the bit string stored in the memory array; and
    storing an exact result of the second operation in the peripheral circuitry.

8. The method of claim 7, wherein the first operation and the second operation are performed as part of a recursive operation, and wherein the method further comprises:
    determining that the result of the second operation is a final resultant bit string of the recursive operation; and
    performing an operation to round the final resultant bit string stored in the peripheral circuitry subsequent to the determination such that the final resultant bit string has a particular bit width.

9. The method of claim 8, further comprising removing at least one bit from a mantissa bit sub-set or an exponent bit sub-set of the final resultant bit string to round the final resultant bit string stored in the peripheral circuitry.

10. The method of claim 9, further comprising:
    receiving a user command to remove the at least one bit; and
    rounding, in response to the user command, the final resultant bit string to have a bit width defined by the user command.

11. The method of claim 8, further comprising transferring the rounded final resultant bit string to the memory array.

12. The method of claim 8, wherein the first operation and the second operation are performed as part of a recursive operation, and wherein the method further comprises:

determining that the result of the second operation is a final resultant bit string of the recursive operation; and performing an operation to convert the final resultant bit string to a Type III universal number format or a posit format.

13. The method of claim 7, wherein the result of the first operation or the second operation has a greater bit width than the result of the other of the first operation and the second operation.

14. The method of claim 8, further comprising:

converting the result of the first operation from the universal number format to a different format prior to storing the result of the first operation in the peripheral circuitry; and converting the result of the second operation from universal number format to the different format prior to storing the result of the second operation in the peripheral circuitry.

15. A system, comprising:

a memory device comprising a memory array and a plurality of sense amplifiers, the memory array comprising a same quantity of rows or columns as a quantity of sense amplifiers of the plurality of sense amplifiers; and a processing device coupled to the memory device and configured to:

cause one or more bit strings formatted in a universal number format to be written from the memory array to a memory resource external to the memory array and coupled to the processing resource;

cause performance of a first iteration of recursive operation using the one or more bit strings;

cause a first resultant bit string representing a result of the first iteration of the recursive operation to be accumulated in the plurality of sense amplifiers;

determine whether to perform a second iteration of the recursive operation using the one or more bit strings written to the memory resource or one or more bit strings stored in the memory array;

cause performance of a second iteration of the recursive operation using the one or more bit strings written to the memory resource or the one or more bit strings stored in the memory array; and cause a second resulting bit string representing a result of the second iteration of the recursive operation to be accumulated in the plurality of sense amplifiers.

16. The system of claim 15, wherein the plurality of sense amplifiers are located in a periphery area of the memory array.

17. The system of claim 15, wherein the one or more bit strings, the resultant bit string, or both, are formatted according to a Type III universal number format or a posit format.

18. The system of claim 15, wherein the recursive operation is performed within the memory array without transferring the resultant bit strings to circuitry external to the memory device.

19. The system of claim 15, wherein the recursive operation includes performance of an arithmetic operation, a logical operation, or both.

20. The system of claim 15, wherein the processing device is further configured to:

determine that the recursive operation is completed; and cause a last resultant bit string stored in the plurality of sense amplifiers to be truncated such that the last resultant bit string has a particular bit width.

21. The system of claim 20, wherein the processing device is further configured to cause at least one bit from a mantissa bit sub-set or an exponent bit sub-set of the last resultant bit string to be deleted to truncate the last resultant bit string.

22. The system of claim 15, wherein the processing device is further configured to cause each successive resultant bit string to be accumulated in the plurality of sense amplifiers by overwriting a preceding resultant bit string stored in the plurality of sense amplifiers.

* * * * *